US010145218B2

(12) United States Patent
Zapata

(10) Patent No.: US 10,145,218 B2
(45) Date of Patent: Dec. 4, 2018

(54) SUPPRESSING OSCILLATIONS DUE TO PATTERN SWITCHING IN LOW DRAWDOWN WELLS

(71) Applicants: Schlumberger Technology Corporation, Sugar Land, TX (US); Chevron Energy Technology Company, Houston, TX (US); Total SA, Courbevoie (FR)

(72) Inventor: Vito Joseph Zapata, Houston, TX (US)

( * ) Notice: Subject to any disclaimer, the term of this patent is extended or adjusted under 35 U.S.C. 154(b) by 562 days.

(21) Appl. No.: 14/854,793

(22) Filed: Sep. 15, 2015

(65) Prior Publication Data

US 2016/0078158 A1 Mar. 17, 2016

Related U.S. Application Data

(60) Provisional application No. 62/050,494, filed on Sep. 15, 2014.

(51) Int. Cl.
*G06F 17/50* (2006.01)
*E21B 43/00* (2006.01)
*E21B 44/00* (2006.01)
*E21B 47/00* (2012.01)

(52) U.S. Cl.
CPC .............. *E21B 43/00* (2013.01); *E21B 44/00* (2013.01); *E21B 47/00* (2013.01); *G06F 17/5009* (2013.01)

(58) Field of Classification Search
USPC .......................................... 703/2, 5; 166/381
See application file for complete search history.

(56) References Cited

U.S. PATENT DOCUMENTS 9,593,562 B2 * 3/2017 Kruspe ............... E21B 43/2401
2014/0350899 A1 * 11/2014 Lu ....................... G06F 17/5009
703/2
2014/0367120 A1 * 12/2014 Kruspe ............... E21B 43/2401
166/381

* cited by examiner

Primary Examiner — Thai Phan
(74) Attorney, Agent, or Firm — Jaime A. Castano

(57) ABSTRACT

From a simulation engine simulating the field operation, simulation variable values corresponding to grid cells are obtained. The grid cells represent at least a portion of the field for simulating the field operation. The simulation variable values are analyzed to generate a scaling factor and adjusted according to the scaling factor to generate adjusted simulation variable values. The scaling factor controls intermediate result deviation between computation iterations of simulating the field operation. Using the simulation engine, a simulation result is generated based at least on the adjusted simulation variable values. A field operation is performed based on the simulation result.

20 Claims, 12 Drawing Sheets

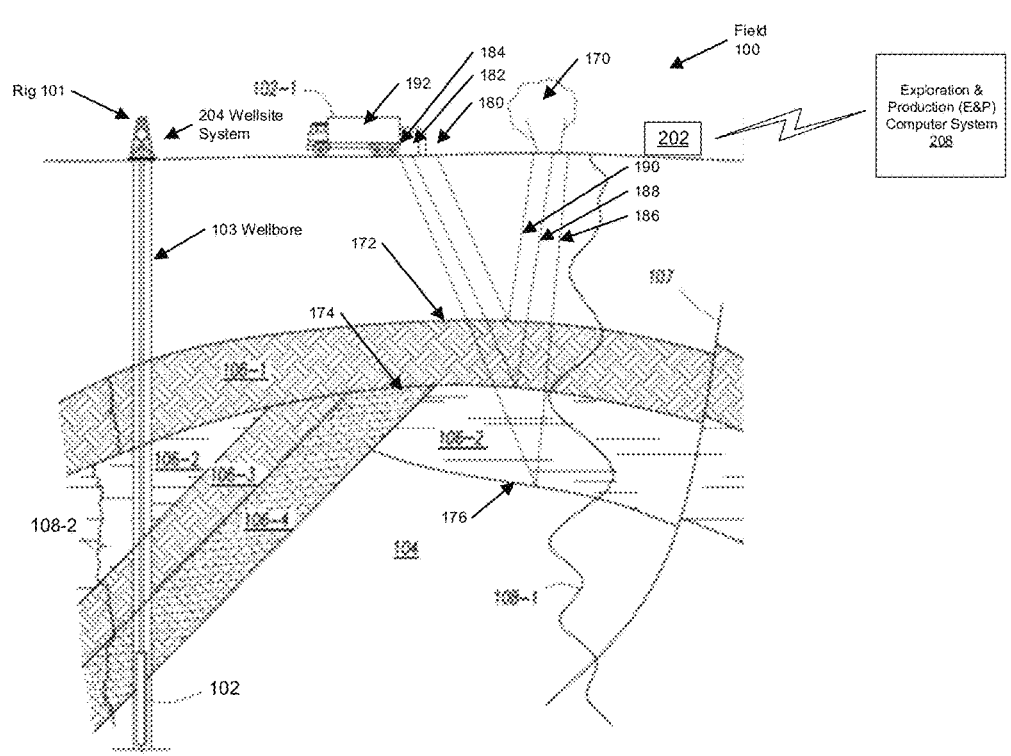
FIG. 1.1

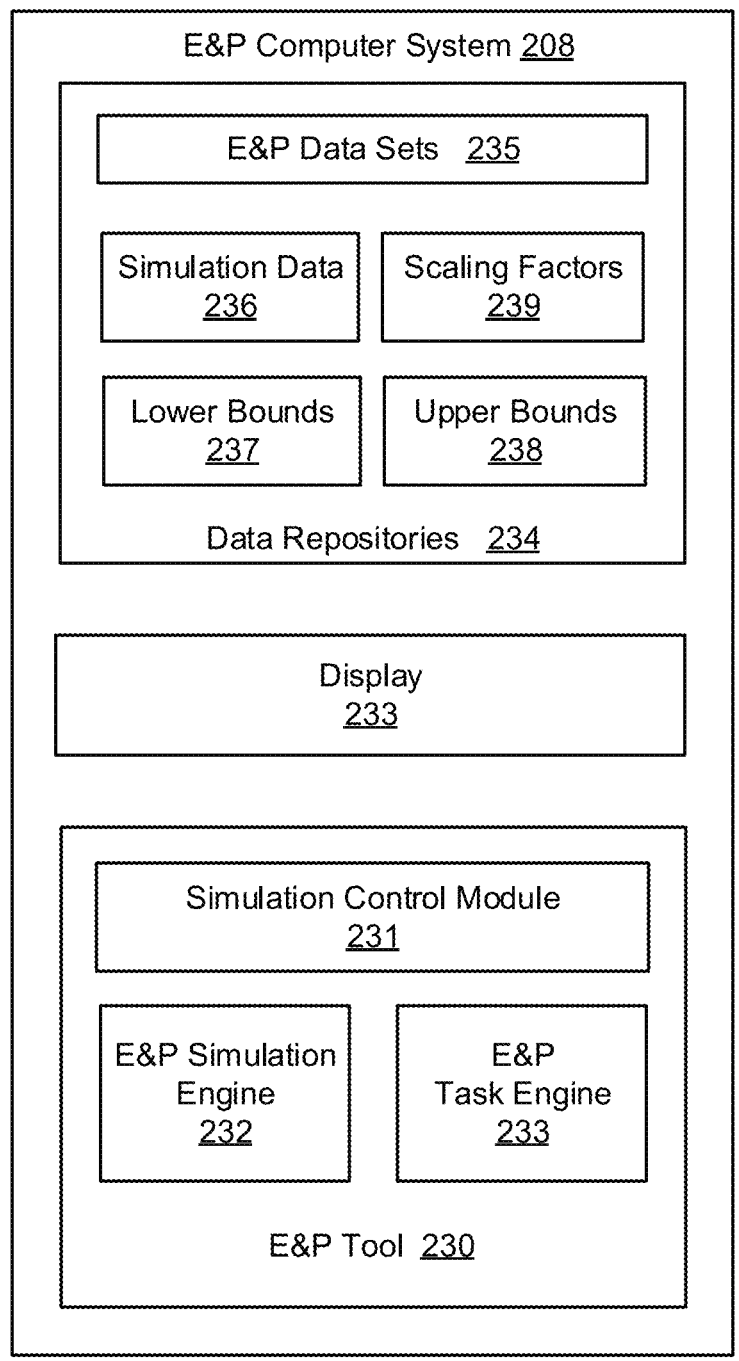
FIG. 1.2

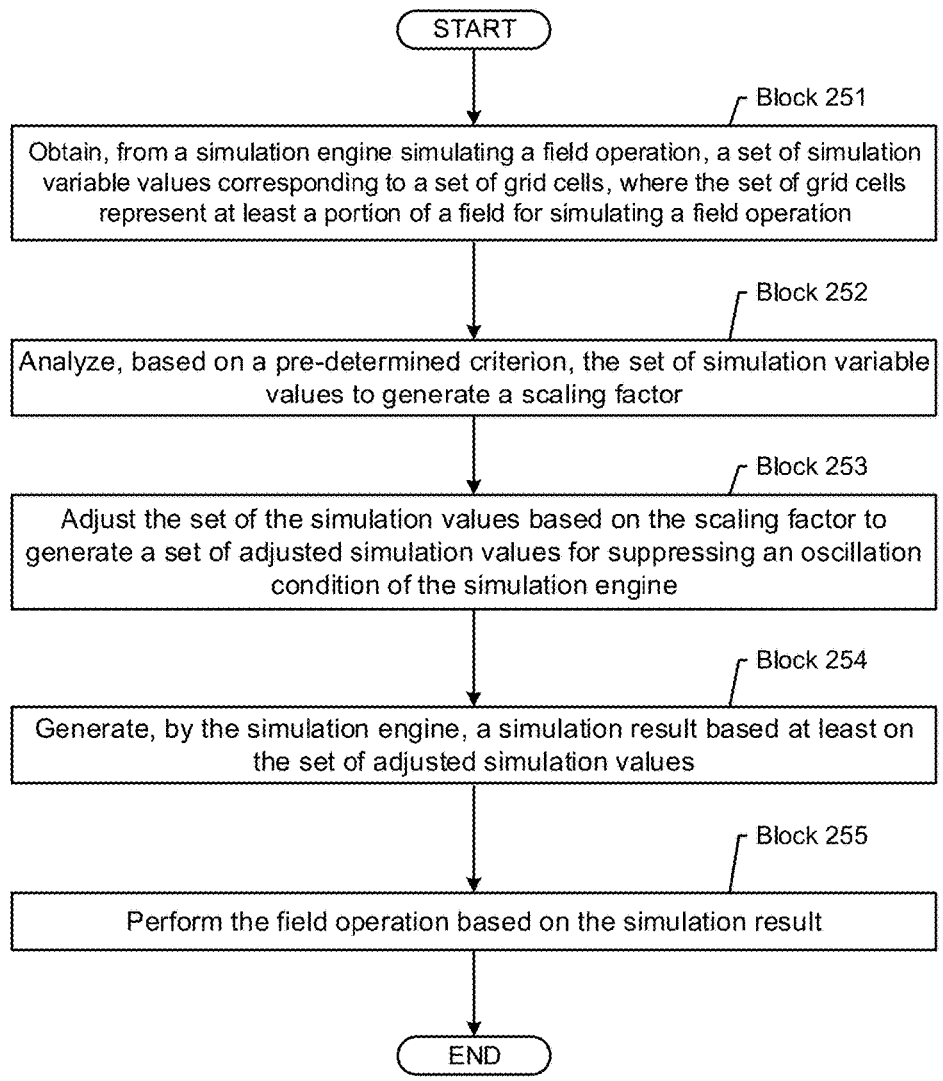
FIG. 2.1

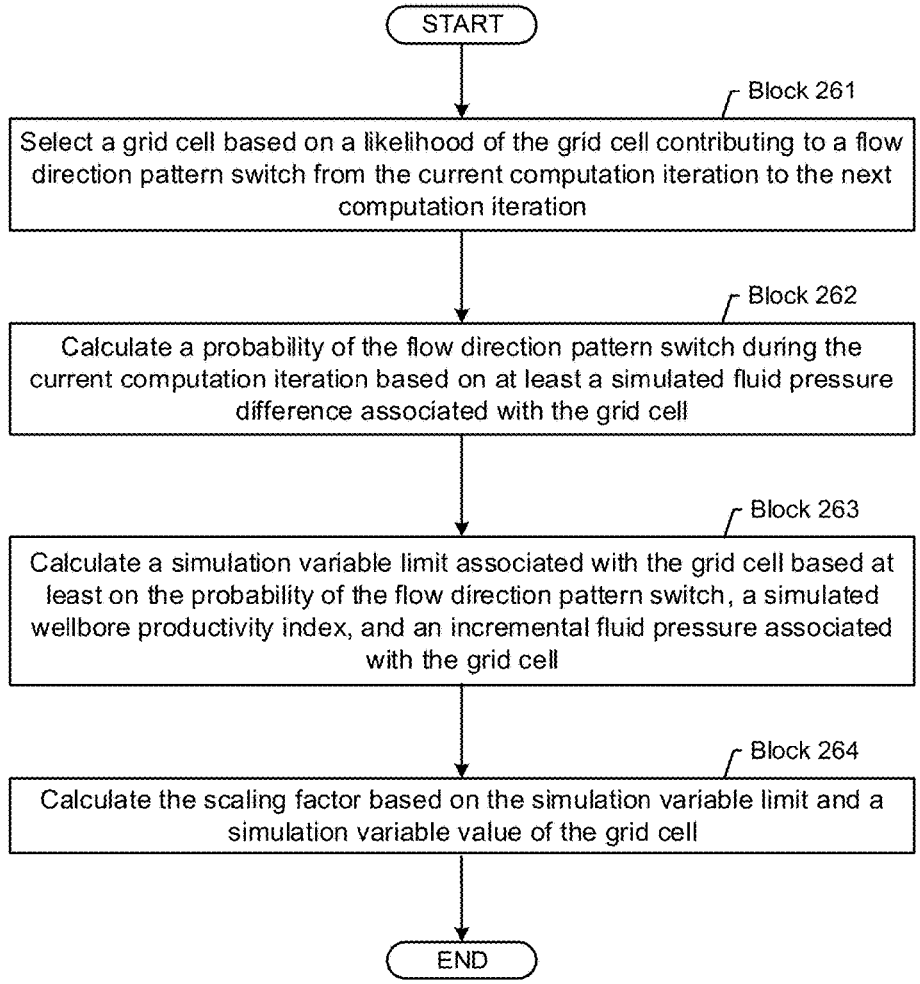
FIG. 2.2

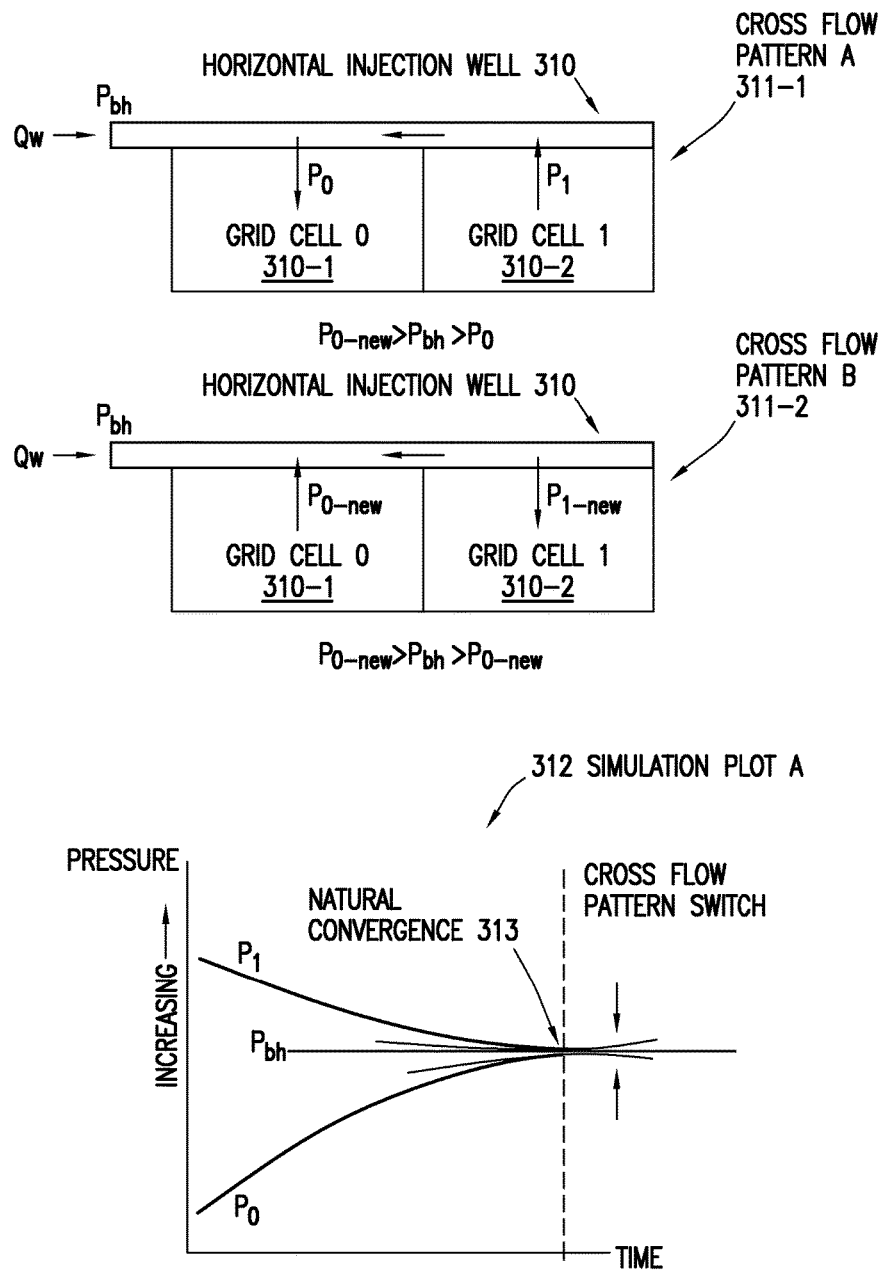
FIG.3.1

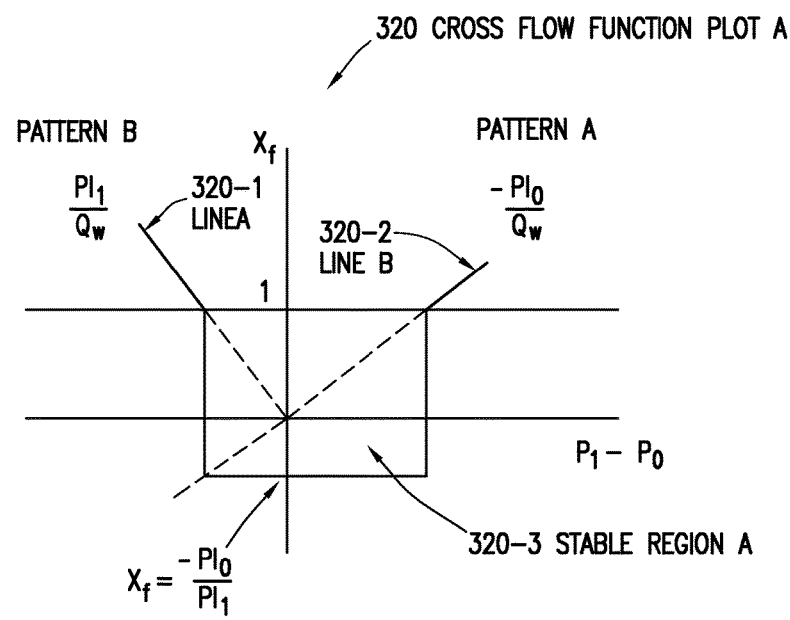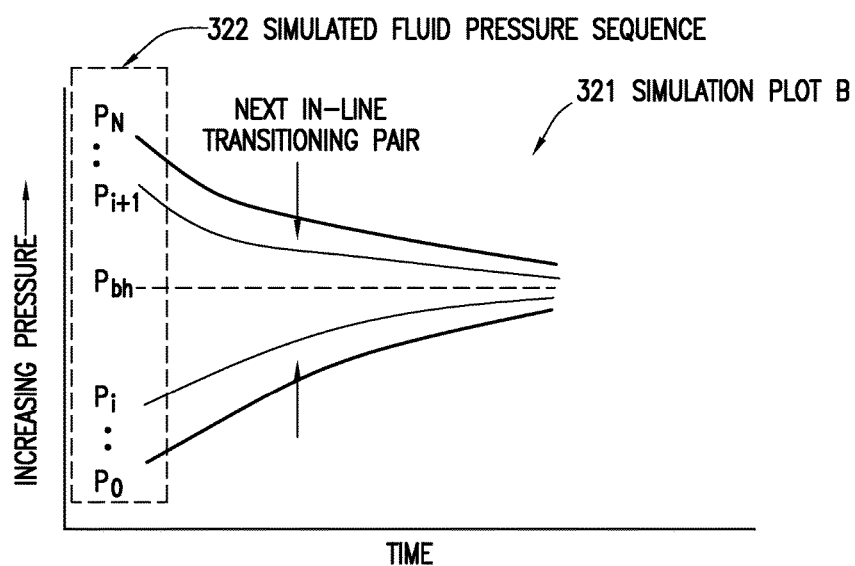
FIG.3.2

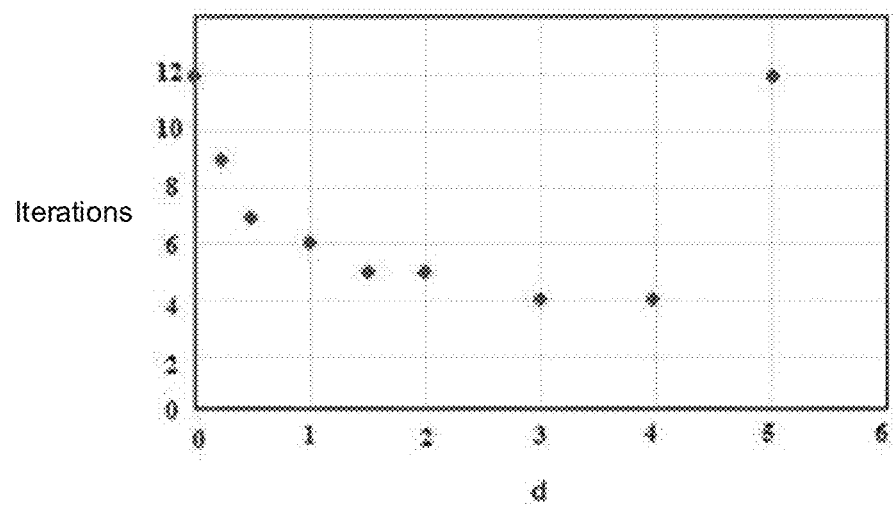
FIG. 3.3

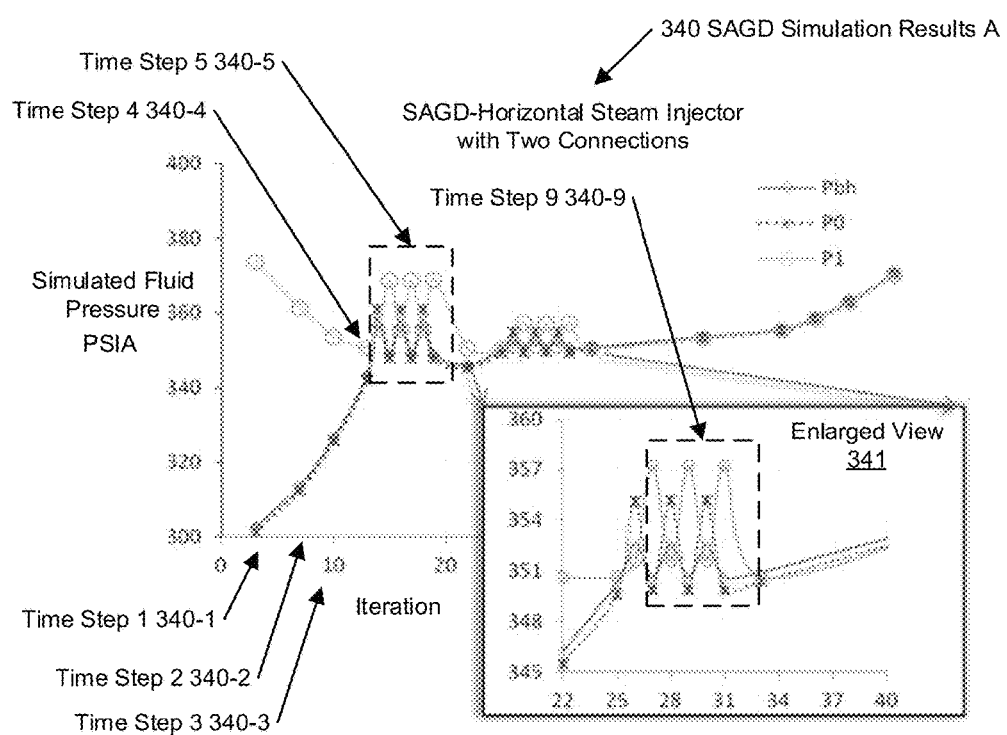
FIG. 3.4

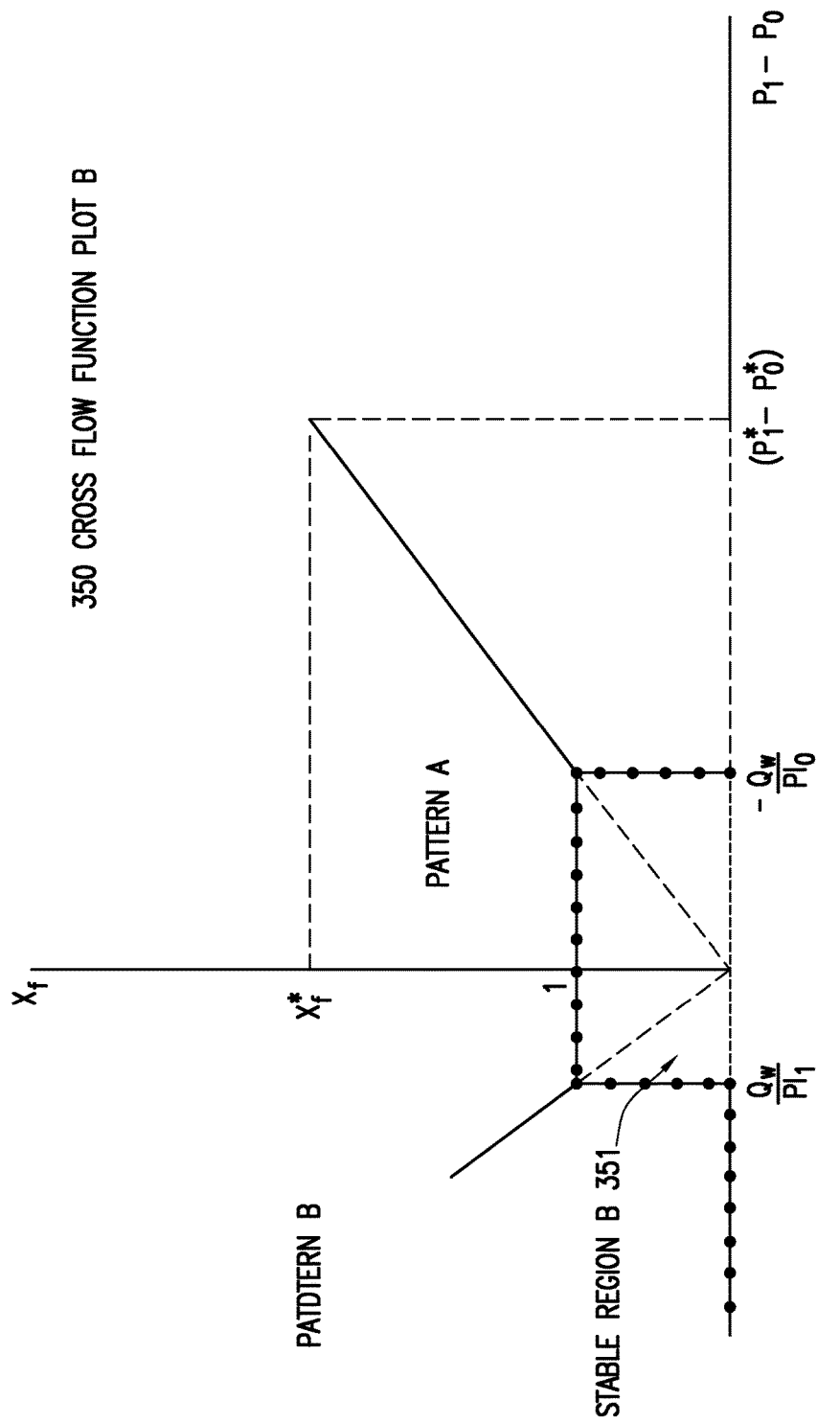
FIG.3.5

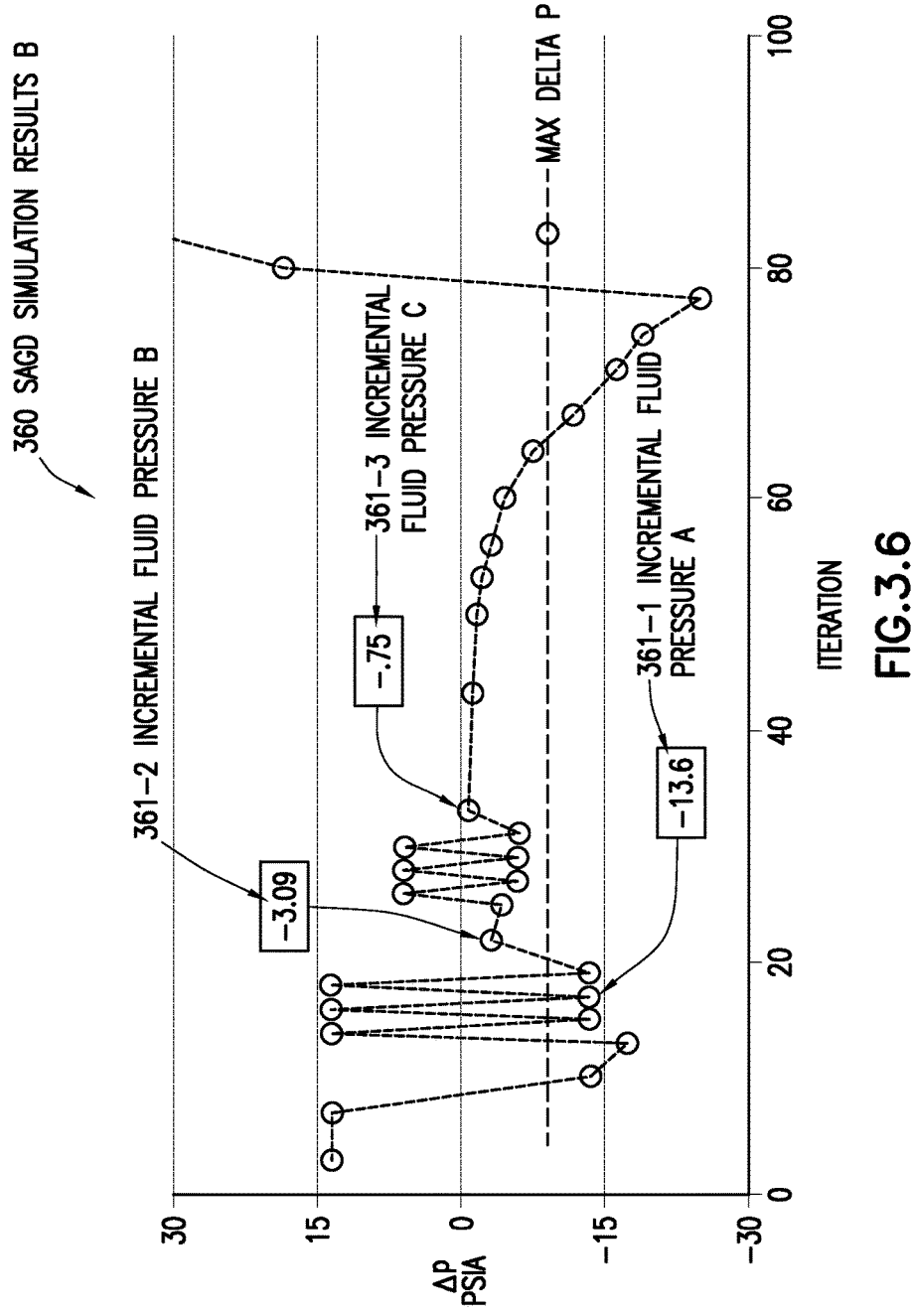

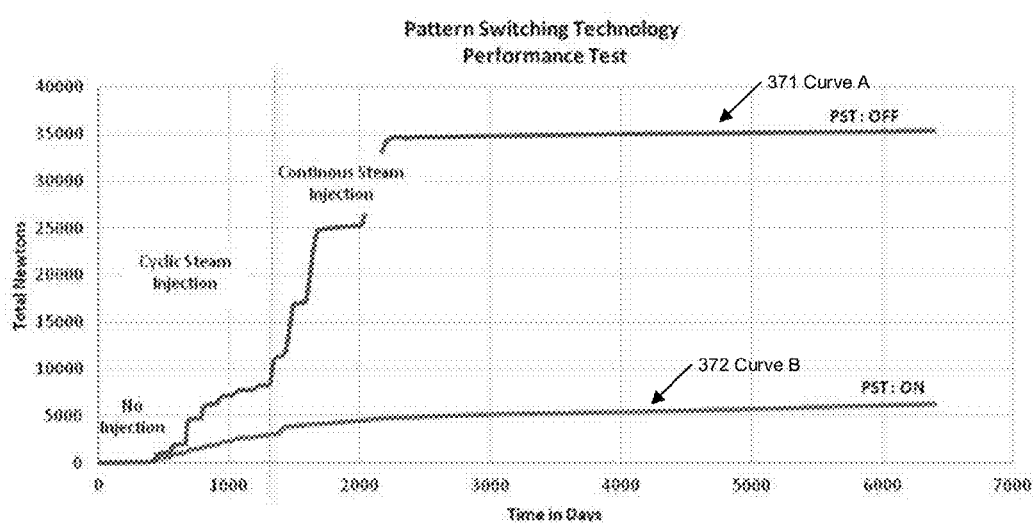
FIG. 3.7

SUPPRESSING OSCILLATIONS DUE TO PATTERN SWITCHING IN LOW DRAWDOWN WELLS

CROSS-REFERENCE TO RELATED APPLICATIONS

This application claims priority, pursuant to 35 U.S.C. § 119(e), to U.S. Provisional Application No. 62/050,494, filed on Sep. 15, 2014, the entirety of which is incorporated by reference herein.

BACKGROUND

Operations, such as geophysical surveying, drilling, logging, well completion, and production, may be performed to locate and gather valuable downhole fluids. The subterranean assets are not limited to hydrocarbons such as oil. Throughout this document, the terms "oilfield" and "oilfield operation" may be used interchangeably with the terms "field" and "field operation" to refer to a site where any type of valuable fluids or minerals can be found and the activities required to extract them. The terms may also refer to sites where substances are deposited or stored by injecting the substances into the surface using boreholes and the operations associated with this process. Further, the term "field operation" refers to a field operation associated with a field, including activities related to field planning, wellbore drilling, wellbore completion, and/or production using the wellbore.

One or more aspects of the field operation may be modeled using simulation tools to optimize a parameter of the field operation and/or estimate a result of the field operation. For wells with low drawdowns, oscillations due to flow reversals (pattern switching) seriously affect the computational performance of a numerical reservoir simulator. There is no state-of-the-art approach to solving this problem efficiently. Currently, models involving low drawdown wells, especially in thermal simulations, require user supplied parameters to limit the time step size to mitigate this problem. This technique is effective but computationally expensive and in many cases prohibitive.

SUMMARY

In general, in one aspect, one or more embodiments relate to performing a field operation in a field. From a simulation engine simulating the field operation, simulation variable values corresponding to grid cells are obtained. The grid cells represent at least a portion of the field for simulating the field operation. The simulation variable values are analyzed to generate a scaling factor and adjusted according to the scaling factor to generate adjusted simulation variable values. The scaling factor controls intermediate result deviation between computation iterations of simulating the field operation. Using the simulation engine, a simulation result is generated based at least on the adjusted simulation variable values. A field operation is performed based on the simulation result.

Other aspects of the invention will be apparent from the following detailed description and the appended claims.

BRIEF DESCRIPTION OF DRAWINGS

The appended drawings illustrate several embodiments of suppressing oscillations due to pattern switching in low drawdown wells and are not to be considered limiting of its scope, for suppressing oscillations due to pattern switching in low drawdown wells may admit to other equally effective embodiments.

FIG. 1.1 is a schematic view, partially in cross-section, of a field in which one or more embodiments of suppressing oscillations due to pattern switching in low drawdown wells may be implemented.

FIG. 1.2 shows an exploration and production (E&P) computer system in accordance with one or more embodiments.

FIGS. 2.1 and 2.2 show method flowcharts in accordance with one or more embodiments.

FIGS. 3.1, 3.2, 3.3, 3.4, 3.5, 3.6, and 3.7 show an example in accordance with one or more embodiments.

DETAILED DESCRIPTION

Figure 4:
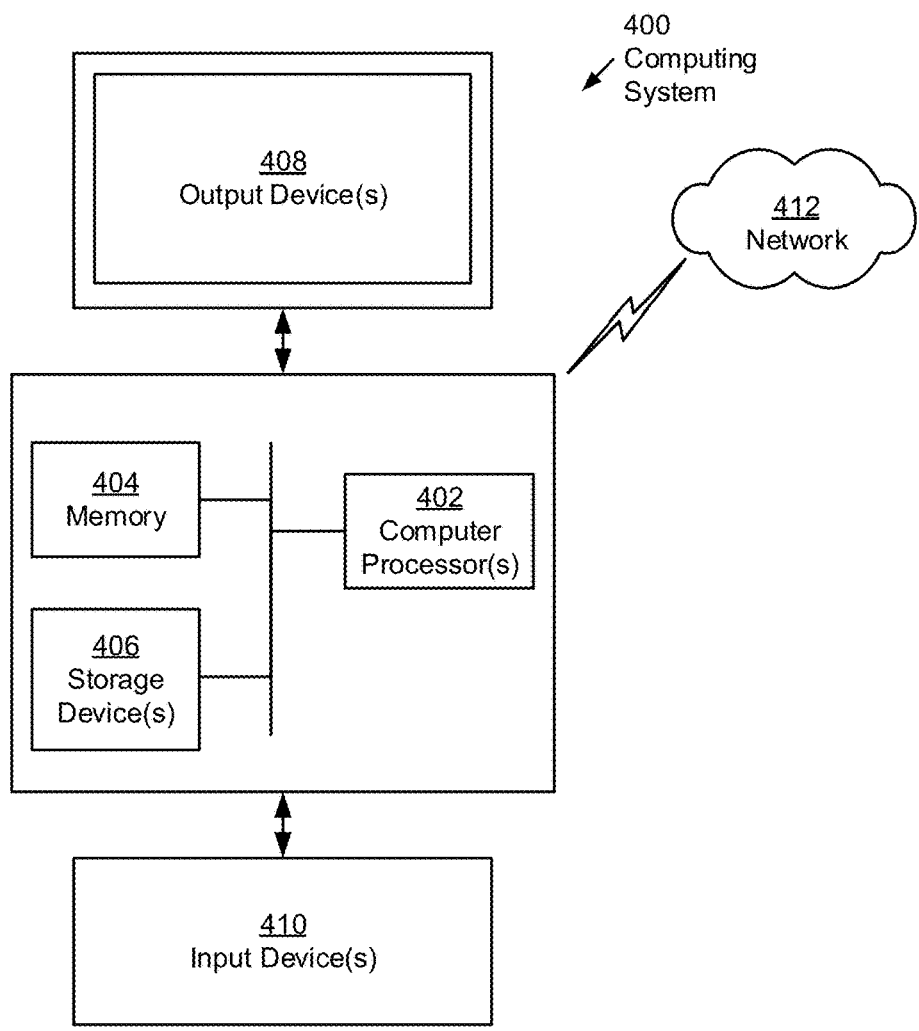
FIG. 4 depicts a computer system using which one or more embodiments of suppressing oscillations due to pattern switching in low drawdown wells may be implemented.

Aspects of the present disclosure are shown in the above-identified drawings and described below. In the description, like or identical reference numerals are used to identify common or similar elements. The drawings are not necessarily to scale and certain features may be shown exaggerated in scale or in schematic in the interest of clarity and conciseness.

Embodiments of suppressing oscillations due to pattern switching in low drawdown wells provide a method and a system to perform simulation of a field operation. In one or more embodiments, the method starts by obtaining, from a simulation engine simulating the field operation, a set of simulation variable values corresponding to a set of grid cells, where the plurality of grid cells represent at least a portion of the field for simulating the field operation. The plurality of simulation variable values is then analyzed to generate a scaling factor to control intermediate result deviation between computation iterations of simulating the field operation. The set of the simulation variable values are adjusted according to the scaling factor to generate a set of adjusted simulation variable values, which is in turn used by the simulation engine to generate a simulation result. Accordingly, the field operation is performed based on the simulation result. As used herein, the term "suppressing oscillations" refers to reducing and, at least in some embodiments, preventing the oscillations.

FIG. 1.1 depicts a schematic view, partially in cross section, of a field (100) in which one or more embodiments of suppressing oscillations due to pattern switching in low drawdown wells may be implemented. In one or more embodiments, one or more of the modules and elements shown in FIG. 1.1 may be omitted, repeated, and/or substituted. Accordingly, embodiments of suppressing oscillations due to pattern switching in low drawdown wells should not be considered limited to the specific arrangements of modules shown in FIG. 1.1.

As shown in FIG. 1.1, the subterranean formation (104) includes several geological structures (106-1 through 106-4). As shown, the formation has a sandstone layer (106-1), a limestone layer (106-2), a shale layer (106-3), and a sand layer (106-4). A fault line (107) extends through the formation. In one or more embodiments, various survey tools and/or data acquisition tools are adapted to measure the formation and detect the characteristics of the geological structures of the formation. As noted above, the outputs of these various survey tools and/or data acquisition tools, as well as data derived from analyzing the outputs, are considered as part of the historic information.

As shown in FIG. 1.1, a seismic truck (102-1) represents a survey tool that is adapted to measure properties of the subterranean formation in a seismic survey operation based on sound vibrations. One such sound vibration (e.g., 186, 188, 190) generated by a source (170) reflects off a plurality of horizons (e.g., 172, 174, 176) in the subterranean formation (104). Each of the sound vibrations (e.g., 186, 188, 190) are received by one or more sensors (e.g., 180, 182, 184), such as geophone-receivers, situated on the earth's surface. The geophones produce electrical output signals, which may be transmitted, for example, as input data to a computer (192) on the seismic truck (102-1). Responsive to the input data, the computer (192) may generate a seismic data output, which may be logged and provided to a surface unit (202) by the computer (192) for further analysis. The computer (192) may be the computer system shown and described in relation to FIG. 4.

Further as shown in FIG. 1.1, the wellsite system (204) is associated with a rig (101), a wellbore (103), and other wellsite equipment and is configured to perform wellbore operations, such as logging, drilling, fracturing, production, or other applicable operations. Generally, survey operations and wellbore operations are referred to as field operations of the field (100). These field operations may be performed as directed by the surface unit (202).

In one or more embodiments, the surface unit (202) is operatively coupled to the computer (192) and/or a wellsite system (204). In particular, the surface unit (202) is configured to communicate with the computer (192) and/or the data acquisition tool (102) to send commands to the computer (192) and/or the data acquisition tool (102) and to receive data therefrom. For example, the data acquisition tool (102) may be adapted for measuring downhole properties using logging-while-drilling ("LWD") tools. In one or more embodiments, surface unit (202) may be located at the wellsite system (204) and/or remote locations. The surface unit (202) may be provided with computer facilities for receiving, storing, processing, and/or analyzing data from the computer (192), the data acquisition tool (102), or another part of the field (100). The surface unit (202) may also be provided with or have functionality for actuating mechanisms at the field (100). The surface unit (202) may then send command signals to the field (100) in response to data received, for example to control and/or optimize various field operations described above.

In one or more embodiments, the data received by the surface unit (202) represent characteristics of the subterranean formation (104) and may include seismic data and/or information related to porosity, saturation, permeability, natural fractures, stress magnitude and orientations, elastic properties, etc. during a drilling, fracturing, logging, or production operation of the wellbore (103) at the wellsite system (204). For example, data plot (108-1) may be a seismic two-way response time or other types of seismic measurement data. In another example, data plot (108-2) may be a wireline log, which is a measurement of a formation property as a function of depth taken by an electrically powered instrument to infer properties and make decisions about drilling and production operations. The record of the measurements, e.g., on a long strip of paper, may also be referred to as a log. Measurements obtained by a wireline log may include resistivity measurements obtained by a resistivity measuring tool. In yet another example, the data plot (108-2) may be a plot of a dynamic property, such as the fluid flow rate over time during production operations. Other data may also be collected, such as, but not limited to, historical data, user inputs, economic information, other measurement data, and other parameters of interest.

In one or more embodiments, the surface unit (202) is communicatively coupled to an exploration and production (E&P) computer system (208). In one or more embodiments, the data received by the surface unit (202) may be sent to the E&P computer system (208) for further analysis. Generally, the E&P computer system (208) is configured to analyze, model, control, optimize, or perform management tasks of the aforementioned field operations based on the data provided from the surface unit (202). In one or more embodiments, the E&P computer system (208) is provided with functionality for manipulating and analyzing the data, such as performing seismic interpretation or borehole resistivity image log interpretation to identify geological surfaces in the subterranean formation (104) or performing simulation, planning, and optimization of production operations of the wellsite system (204). In one or more embodiments, the result generated by the E&P computer system (208) may be displayed for user viewing using a two dimensional (2D) display, three dimensional (3D) display, or other suitable displays. Although the surface unit (202) is shown as separate from the E&P computer system (208) in FIG. 1.1, in other examples, the surface unit (202) and the E&P computer system (208) may also be combined.

FIG. 1.2 shows more details of the E&P computer system (208) in which one or more embodiments of suppressing oscillations due to pattern switching in low drawdown wells may be implemented. In one or more embodiments, one or more of the modules and elements shown in FIG. 1.2 may be omitted, repeated, and/or substituted. Accordingly, embodiments of suppressing oscillations due to pattern switching in low drawdown wells should not be considered limited to the specific arrangements of modules shown in FIG. 1.2.

As shown in FIG. 1.2, the E&P computer system (208) includes an E&P tool (230), a display (233), and a data repository (234). In one or more embodiments, the E&P tool (230) is configured to manipulate and analyze the field data, such as performing seismic interpretation or borehole resistivity image log interpretation to identify geological surfaces in the subterranean formation (104) shown in FIG. 1.1 above, or performing simulation, planning, and optimization of production operations of the wellsite system (204) shown in FIG. 1.1 above. In one or more embodiments, the data repository (234) is configured to store the field data (e.g., E&P data sets (235)) and intermediate or final results (e.g., the simulation data (236), the scaling factors (239), the lower bounds (237), and the upper bounds (238)) of the E&P tool (230). In one or more embodiments, the data repository (234) may be distributed and residing on separate nodes of the E&P computer system (208). In addition, the E&P tool (230) includes a simulation control module (231), an E&P simulation engine (232), and an E&P task engine (233). Each of these elements is described below.

In one or more embodiments, the E&P simulation engine (232) corresponds to a software and/or hardware component that is configured to simulate a field operation. Generally, at least a portion of the field is represented by a set of grid cells for simulating the field operation. In one or more embodiments, the E&P simulation engine (232) generates a converged simulation result at each of a sequence of time points throughout a user specified simulation time period (e.g., hours, days, weeks, months, years, etc.). For example, any two successive time points in the sequence of time points may be separated by a fixed time gap that is referred to as the simulation time step. The simulation time step, or time step, may be pre-determined or user specified. Each of the sequence of time points is referred to as a particular time step, e.g., identified by a sequence number, such as the first time step, the second time step, or the nth time step during the simulation time period. For each simulation time step, multiple (e.g., 10, 100, 1000, etc.) computation iterations may be performed to generate the converged simulation result. Specifically, the E&P simulation engine (232) generates a simulation variable value for each grid cell in each computation iteration (also referred to as Newton). As the simulation iterates through the large number of computation iterations, the simulation variable value for each grid cell converges and contributes to the converged simulation result. In one or more embodiments, the simulation variable values and data representing the grid cells are part of intermediate and/or final results used/generated by the E&P simulation engine (232). The intermediate and/or final results used/generated by the E&P simulation engine (232) are stored in the data repository (234) as the simulation data (236).

In one or more embodiments, a computation iteration (referred to as current computation iteration) is immediately preceded by a previous computation iteration and is immediately followed by a next computation iteration. In other words, the previous computation iteration and the next computation iteration are adjacent (along a time scale) to the current computation iteration in a sequence of computation iterations for completing each time step of the simulation.

In one or more embodiments, the field operation includes an injection operation and/or production operation of a wellbore. During the simulation of the injection operation and/or production operation, the field penetrated by the wellbore is represented by the set of grid cells. Each grid cell corresponds to a segment of the field and is associated with simulation variables representing physical characteristics of the corresponding segment. In other words, the field is partitioned into three dimensional segments, where each segment is represented by a grid cell. During each computation iteration, the E&P simulation engine (232) generates simulation variable values for each grid cell, such as a simulated fluid flow direction and a simulated fluid pressure that are associated with the wellbore. In particular, the simulated fluid flow direction and the simulated fluid pressure that were generated for each grid cell during the previous computation iteration are used as inputs or a starting point for the current computation iteration. Upon completion, the simulated fluid flow direction and the simulated fluid pressure that are generated for each grid cell during the current computation iteration are used as inputs or the next starting point for the next computation iteration. Generally, the simulated fluid pressure generated during the current computation iteration differs from the simulated fluid pressure generated during the previous computation iteration. In this context, an incremental fluid pressure for each grid cell is generated during each computation iteration. The incremental fluid pressure is the incremental amount of change in the simulated fluid pressure. For example, the incremental fluid pressure generated during the current computation iteration corresponds to the incremental difference in the simulated fluid pressure between the current computation iteration and the previous computation iteration. In this context, the simulated fluid pressure generated during the previous computation iteration is modified by adding the incremental fluid pressure generated during the current computation iteration to become the input for starting the next computation iteration. Similarly, the incremental fluid pressure generated during the next computation iteration corresponds to the incremental difference in the simulated fluid pressure between the next computation iteration and the current computation iteration, and so on and so forth throughout the remaining computation iterations in the time step. Generally, the incremental fluid pressure for each grid cell converges to zero as the sequence of computation iterations ends and the simulated fluid pressure for each grid cell becomes a part of the converged simulation result of the time step.

In one or more embodiments, the simulated fluid flow directions of at least a portion of the grid cells connected to the wellbore form a flow direction pattern. Specifically, the flow direction pattern is a sequence of simulated fluid flow directions. In one or more embodiments, each simulated fluid flow direction in the sequence of simulated fluid flow directions is indexed by a grid cell identifier. In other words, the flow direction pattern includes multiple simulated fluid flow directions of the grid cells disposed along and connected to the wellbore. In one or more embodiments, the flow direction pattern is generated by each computation iteration and may either change or remain stable throughout the computation iterations within a single time step. A pattern switch or switch of the flow direction pattern is the change of the flow direction pattern (e.g., due to reversal of one or more simulated fluid flow directions in the flow direction pattern). For example, the pattern switch may occur between two adjacent computation iterations (along a time scale) within a single time step. In another example, the pattern switch may occur between two adjacent time steps (along a time scale). In one or more embodiments, the sequence of simulated fluid flow directions are ordered in the flow direction pattern according to physical locations of the grid cells along the wellbore. In one or more embodiments, the sequence of simulated fluid flow directions are ordered in the flow direction pattern according to simulated fluid pressures of corresponding grid cells. When the simulated fluid flow directions in the flow direction pattern are unilaterally flowing into the wellbore, the flow direction pattern is referred to as a production flow direction pattern. When the simulated fluid flow directions in the flow direction pattern are unilaterally flowing out from the wellbore, the flow direction pattern is referred to as an injection flow direction pattern. When the simulated fluid flow directions in the flow direction pattern includes both inward and outward flow directions with respect to the wellbore, the flow direction pattern is referred to as a cross flow direction pattern. Examples of cross flow direction patterns are described in reference to FIG. 3.1 below. An example of the pattern switch and an example of the flow direction pattern according to simulated fluid pressures of corresponding grid cells are described in reference to FIG. 3.2 below.

In one or more embodiments, the simulation control module (231) corresponds to a software and/or hardware component that is configured to obtain, from the E&P simulation engine (232) for each computation iteration, a set of simulation variable values corresponding to the set of grid cells. In one or more embodiments, the set of simulation variable values are analyzed by the simulation control module (231) to generate a scaling factor. The scaling factor controls deviation (e.g., the incremental fluid pressure) between computation iterations of simulating the field operation. Accordingly, the scaling factors of one or more iterations of one or more simulation time steps are stored as intermediate data (i.e., scaling factors (239)) in the data repository (234). In one or more embodiments, each of the scaling factors (239) is generated based on a desired upper bound and lower bound of the simulation variable value for each grid cell. In particular, the upper bound corresponds to a maximal value exceeding the simulation variable values while the lower bound corresponds to a minimal value less than the simulation variable values. Accordingly, the computed upper and lower bounds are also stored as intermediate data (i.e., lower bounds (237), upper bounds (238)) in the data repository (234). In one or more embodiments, the set of simulation variable values includes the aforementioned simulated fluid flow, simulated fluid pressure, and incremental fluid pressure. In one or more embodiments, the scaling factor for each computation iteration is generated by analyzing the simulated fluid flows, simulated fluid pressures, incremental fluid pressures, and flow direction patterns of the set of grid cells. In one or more embodiments, the scaling factor for each computation iteration is generated by the simulation control module (231) using the method described in reference to FIG. 2.2 below.

In one or more embodiments, for each computation iteration, the simulation control module (231) adjusts the set of the simulation variable values based on the scaling factor (i.e., one of the scaling factors (239) corresponding to the computation iteration) to generate a set of adjusted simulation variable values. In particular, the simulation variable values generated by the E&P simulation engine (232) are adjusted by the simulation control module (231) for suppressing an oscillation condition of the E&P simulation engine (232). In one or more embodiments, the oscillation condition includes overshoots and undershoots of the aforementioned incremental fluid pressure over a portion of the computation iteration sequence in the time step. As used herein, the overshoot is the occurrence of the incremental fluid pressure or simulated fluid pressure exceeding a target or an expected value (e.g., a steady state value). Similarly, the undershoot is the occurrence of the incremental fluid pressure or simulated fluid pressure dipping below a target or an expected value (e.g., a steady state value). For example, the oscillation condition may include multiple pattern switches caused by these overshoots and undershoots of the incremental fluid pressure of one or more grid cells. An example of the oscillation condition is described in reference to FIG. 3.4 below. In one or more embodiments, the simulation control module (231) adjusts the set of the simulation variable values for each computation iteration in each time step of the simulation session. The set of adjusted simulation variable values are then returned to the E&P simulation engine (232). Accordingly, the E&P simulation engine (232) generates the simulation result based on the set of adjusted simulation variable values throughout the computation iterations for each simulation time step.

In one or more embodiments, prior to the E&P simulation engine (232) starting the next computation iteration of simulating the injection and/or production operation of the wellbore, the incremental fluid pressure generated for each grid cell during the current computation iteration is scaled by the scaling factor for the current computation iteration. The scaled incremental fluid pressure is added to the simulated fluid pressure generated during the previous computation iteration to generate an adjusted value of the simulated fluid pressure for the current computation iteration. In other words, the simulated fluid pressure generated during the current computation iteration is adjusted according to the scaling factor. The adjusted value of the simulated fluid pressure for each grid cell is then returned to the E&P simulation engine (232) as input to start the next computation iteration. In one or more embodiments, the scaling factor converges to one as the simulation result of the time step converges through the sequence of computation iterations. In one or more embodiments, generating the simulation result based on the adjusted simulation variable values results in a reduced number of computation iterations. In one or more embodiments, the simulated fluid pressure generated during the current computation iteration is adjusted according to the scaling factor by the simulation control module (231) using the method described in reference to FIG. 2.2 below. An example of reducing the number of computation iterations according to the scaling factor within a time step is described in reference to FIG. 3.3 below. An example of reducing the number of computation iterations according to the scaling factor throughout a simulation session is described in reference to FIG. 3.7 below.

In one or more embodiments, the E&P task engine is configured to perform the field operation based on the simulation result. A field operation is any operation that affects the oilfield. For example, a field operation may be to adjust the physical equipment located at the oilfield, modify the drilling technique, or to perform another such operation that physically affects the oilfield.

FIG. 2.1 depicts an example method in accordance with one or more embodiments. For example, the method depicted in FIG. 2.1 may be practiced using the E&P computer system (208) described in reference to FIGS. 1.1 and 1.2 above. In one or more embodiments, one or more of the elements shown in FIG. 2.1 may be omitted, repeated, and/or performed in a different order. Accordingly, embodiments of the method and system for suppressing oscillations due to pattern switching in low drawdown wells should not be considered limited to the specific arrangements of elements shown in FIG. 2.1.

In Block 251, a set of simulation variable values corresponding to a set of grid cells are obtained from a simulation engine simulating the field operation. In particular, the set of grid cells represent at least a portion of the field for simulating a field operation. In one or more embodiments, the field operation includes an injection operation and/or production operation of a wellbore. In such embodiments, a simulated fluid flow direction and a simulated fluid pressure are obtained for each grid cell from the simulation engine. For example, the simulated fluid flow direction and a simulated fluid pressure may be generated by a linear solver of the simulation engine.

In Block 252, the set of simulation variable values is analyzed to generate a scaling factor. In one or more embodiments where the field operation includes the aforementioned injection operation and/or production operation, the simulated fluid flow direction and the simulated fluid pressure are analyzed for grid cells in proximity and/or connected to the wellbore to generate the scaling factor. In one or more embodiments, analyzing the set of simulation variable values includes:
  (i) calculating, based on the set of simulation variable values, a set of simulation variable limits (e.g., upper bounds and lower bounds) corresponding to the set of grid cells,
  (ii) identifying a simulation variable limit from the set of simulation variable limits that is associated with a grid cell,
  (iii) identifying a simulation variable value from the set of simulation variable values that is associated with the identified grid cell,
  (iv) comparing the simulation variable limit and the simulation variable value to generate a result, (v) selecting, in response to the result meeting a pre-determined criterion, the identified grid cell from the set of grid cells, and (vi) calculating, in response to the selecting, the scaling factor based on the simulation variable limit and the simulation variable value of the identified and selected grid cell.

Additional details of elements (i) through (vi) of Block 252 are described in reference to FIG. 2.2 below.

In Block 253, the set of the simulation variable values are adjusted based on the scaling factor to generate a set of adjusted simulation variable values for suppressing an oscillation condition of the simulation engine. In one or more embodiments, the set of the simulation variable values are adjusted for a current computation iteration where the set of adjusted simulation variable values are used as inputs for the next computation iteration.

In one or more embodiments, prior to starting the next computation iteration of simulating the injection and/or production operation, the simulated fluid pressure generated for each grid cell during the current computation iteration is adjusted by scaling the incremental fluid pressure according to the scaling factor. Specifically, the scaled incremental fluid pressure is added to the simulated fluid pressure generated during the previous computation iteration to generate an adjusted value of the simulated fluid pressure for the current computation iteration. The adjusted value of the simulated fluid pressure for each grid cell is then used as input to start the next computation iteration.

In Block 254, a simulation result is generated by the simulation engine based at least on the set of adjusted simulation variable values. For example, the simulation result of the injection and/or production operation at each time step may be generated based on the adjusted value of the simulated fluid pressure for each grid cell throughout the sequence of computation iterations in the time step. In one or more embodiments, generating the simulation result based at least on the set of adjusted simulation variable values results in a reduced number of computation iterations in the time step. In particular, the scaling factor converges to one as the simulation result converges through the reduced number of computation iterations. An example of the scaling factor converging through the iterations is shown in TABLE 1 below.

TABLE 1

| Iteration | Scaling Factor |
|---|---|
| 1 | 0.102129 |
| 2 | 0.0294445 |
| 3 | 0.0534163 |
| 4 | 0.0863726 |
| 5 | 0.186816 |
| 6 | 0.411523 |
| 7 | 0.361394 |
| 8 | 0.847729 |
| 9 | 1.0000000 Time step converged |

In Block 255, the field operation is performed based on the simulation result. For example, the injection and/or production operation may be performed based on the simulation result of each time step throughout the simulation session over the user specified simulation timer period. In one or more embodiments, the simulation result may include wellbore flow rates and corresponding control settings of various control mechanisms associated with the wellbore. In such a scenario, performing the simulation operations includes physically adjusting the control settings of filed equipment to generate the wellbore flow rate.

FIG. 2.2 depicts an example method in accordance with one or more embodiments. Specifically, the example method analyzes the set of simulation variable values to generate a scaling factor. For example, the method depicted in FIG. 2.2 may be practiced using the E&P computer system (208) described in reference to FIGS. 1.1 and 1.2 above. In one or more embodiments, one or more of the elements shown in FIG. 2.2 may be omitted, repeated, and/or performed in a different order. Accordingly, embodiments of the method and system for suppressing oscillations due to pattern switching in low drawdown wells should not be considered limited to the specific arrangements of elements shown in FIG. 2.2.

In Block 261, a grid cell is selected, based on a pre-determined criterion, from the grid cells connected to the wellbore for the field operation. In one or more embodiments, the grid cell is one of two adjacent grid cells that are selected based on the pre-determined criterion. The two adjacent grid cells form a grid cell pair. In other words, the selected grid cell is within the selected grid cell pair. In one or more embodiments, a flow direction pattern of the wellbore is identified based on the simulated flow direction of each of the connected grid cells. Accordingly, the grid cell pair is selected based on a likelihood of the grid cell pair contributing to a switch of the flow direction pattern from the current computation iteration to the next computation iteration. An example of selecting the grid cell pair most likely to switch next is described in reference to FIG. 3.2 below.

In Block 262, a probability of the switch of the flow direction pattern from the current computation iteration to the next computation iteration is calculated based on a simulated pressure drawdown of the wellbore and a difference of the simulated fluid pressure of the grid cell pair. An example of calculating the probability using Eq. (1) through Eq. (4) is described below where the probability corresponds to the dimensionless ratio Xf.

In Block 263, a simulation variable limit associated with the grid cell is calculated based on the simulation variable values. Examples of calculating the simulation variable limit using Eq. (7), Eq. (10), Eq. (13), Eq. (17), and Eq. (18) are described below. For example, the simulation variable limit associated with the grid cell is calculated based at least on the probability of the switch of the flow direction pattern, a simulated wellbore productivity index of the grid cell pair, and the incremental fluid pressure of the grid cell pair. Generally, the productivity index represents a characteristic of a portion of the reservoir (e.g., a grid cell) to accept or give up fluids.

In Block 264, the scaling factor is calculated based on the simulation variable limit and a simulation variable value of the selected grid cell most likely to switch next. An example of calculating the scaling factor using Eq. (11) is described below based on a two-connection stability model and a N-connectivity stability model.

FIGS. 3.1, 3.2, 3.3, 3.4, 3.5, 3.6, and 3.7 show an example in accordance with one or more embodiments. Specifically, FIGS. 3.1-3.7 show an example of thermal simulation of the SAGD (Steam Assisted Gravity Drive) process performed using the E&P computer system (208) and the E&P tool (230) described in reference to FIG. 1.2 as well as the method flowcharts described in reference to FIGS. 2.1 and 2.2. During the example thermal simulation, the scaling factors are computed and used to suppress oscillations due to pattern switching in the horizontal steam injectors. These oscillations occur at the onset of steam injection. Although pattern switching is a short lived phenomenon, the associated degradation in computational performance can be severe.

Although oscillations due to pattern switching may occur in vertical steam injectors, their likelihood is not nearly as high. Theory shows that the larger a well's injectivity, the greater the chance for oscillations to occur for a given time step due to the small pressure drawdowns across its connections.

In the description below, mathematical symbols used are defined where appropriate, or defined based on common meaning understood by those skilled in the art. In particular, ntc or NTC denotes the number of total connection, PI denotes the productivity index, qj denotes the flow quantity of jth connection, and pbh denotes the bottom hole pressure, and Qw denotes a total flow quantity between the wellbore and the reservoir. Generally, the productivity index represents a characteristic of a portion of the reservoir (e.g., a grid cell) to accept or give up fluids. In one or more embodiments, the flow quantities qj and Qw are based on a unit time and correspond to respective flow rates. A mathematical model for analyzing pattern switching in wells capable of cross flowing fluids between connected cells is described below. Based on mathematical derivations described below, an inequality equation is developed that bounds pressure changes for stable transitioning between flow direction patterns. In particular, a formula for computing a scaling factor based on the inequality equation is provided for use within a reservoir simulator to improve performance. The theory used in the development of the scaling factors is based on the rate constraint equation. As a result, wells controlled based on bottom-hole pressure constraint during a field operation may be excluded from the simulation using the disclosed system and method.

FIG. 3.1 shows a schematic example of two grid cells connected to a wellbore, as well as associated simulation results. In particular, fluid flow directions of the grid cells are represented by vertical arrows into and out of the wellbore. The fluid flow direction inside the wellbore is represented by horizontal arrows within the wellbore associated with a total flow rate Qw between the wellbore and the reservoir. As shown in FIG. 3.1, the grid cell 0 (310-1) and grid cell 1 (310-2) form a grid cell pair connected to the horizontal injection well (310). For example, the diameter of the wellbore may be in the range of 6"-8" while the dimensions of each grid cell may be in the range of 10-15 meters on each side. Throughout this disclosure unless otherwise specified, the term "connection" refers to the connection between the wellbore and a grid cell (referred to as connection cell) overlapping or adjoining the wellbore. Two cross flow direction patterns are possible for the grid cell 0 (310-1) and grid cell 1 (310-2). The cross flow direction pattern A (311-1) includes an outward flow direction of the grid cell 0 (310-1) associated with fluid pressure P0 and an inward flow direction of the grid cell 1 (310-2) associated with fluid pressure P1. The cross flow direction pattern B (311-2) includes an inward flow direction of the grid cell 0 (310-1) associated with fluid pressure P0—new and an outward flow direction of the grid cell 1 (310-2) associated with fluid pressure P1—new. For example, the cross flow direction pattern B (311-2) may occur in a different or new computation iteration than the cross flow direction pattern A (311-1). Accordingly, the fluid pressures in the "new" computation iteration are designated as "new" in the subscript.

Generally, two reservoir cells (e.g., the grid cell pair having the grid cell 0 (310-1) and grid cell 1 (310-2)) in communication through the wellbore may reach an equilibrated state as one cell loses fluid to the other via the wellbore. As shown in the simulation plot A (312), the natural convergence (313) of these two pressures P0 and P1 may cause numerical difficulty if the extrapolated solutions overshoot to a condition where pressures of the two connections begin to oscillate, that is, switch their flow directions in tandem. For example, the portion of the simulation plot A (312) to the left hand side of the natural convergence (313) may correspond to the current computation iteration or the current time step having the cross flow direction pattern A (311-1) where p1>pbh>p0. Similarly, the portion of the simulation plot A (312) to the right hand side of the natural convergence (313) may correspond to the next computation iteration or the next time step having the cross flow direction pattern B (311-2) where p0—new>pbh>p1—new. Although the two connections in the grid cell pair are physically adjoining each other in the example shown in FIG. 3.1, the oscillation may also be associated with a grid cell pair having non-adjoining grid cells where the wellbore is connected to more than two grid cells.

Overshooting may exist with Newton's method thereby causing cross flow direction pattern switching to be almost inevitable. In the description below, proper scaling of the pressure solution from the coupled reservoir-well solver is used to prevent oscillations by ensuring the pattern switches to the non-cross flow direction pattern, such as the production pattern or the injection pattern. For example, when both connections are flowing out from the wellbore, pressure may build in both connecting reservoir cells and the tendency to switch patterns may diminish.

Briefly, the scaling factor employed by the disclosed system and method is derived by combining the rate constraint equation Eq. (1) with a bottom-hole pressure relationship Eq. (2) into an inequality Eq. (3). In particular, the rate constraint equation Eq. (1) describes a wellbore operation that is monitored and/or controlled based on the fluid flow rate. For horizontal low rate injection wells, gravity and friction may be ignored. The two equations given below omit the pressure losses due to gravity and friction. In particular, Eq. (1) and Eq. (2) are applicable to the cross flow direction pattern A (311-1) where the injection is into the grid cell 0 (310-1). The symbols used in Eq. (1) and Eq. (2) correspond to the symbols used in describing the cross flow direction pattern A (311-1) and the cross flow direction pattern B (311-2) of the grid cell 0 (310-1) and grid cell 1 (310-2) in FIG. 3.1.

$$Q_w = PI_0(p_0 - p_{bh}) + PI_1(p_1 - p_{bh}) \qquad \text{Eq. (1)}$$

$$p_{bh} = p_0 + c(p_1 - p_0) \qquad \text{Eq. (2)}$$

Given that the interpolation parameter, c, in the bottom-hole pressure relationship is bound between zero and one, an inequality relating the connection pressures with a pattern switching event is derived as Eq. (3) below.

$$-\frac{Q_w}{PI_0} \le p_1 - p_0 \qquad \text{Eq. (3)}$$

For the wellbore to remain in its current state or current flow direction pattern, the above inequality states that the pressure difference between the two grid cells is greater than or equal to the pressure drawdown used to flow the total rate Qw between the injecting wellbore and the reservoir. Dividing both sides of the inequality Eq. (3) by the positive quantity $$-\frac{Q_w}{PI_0}$$

yields Eq. (4) below.

$$1 \leq X_f \qquad \text{Eq. (4)}$$

In Eq. (4), the cross flow function $$X_f = \frac{PI_0(p_1 - p_0)}{-Q_w}$$

is a dimensionless ratio which characterizes the tendency of the wellbore, or more specifically a grid cell pair of the wellbore, to transition from its current flow direction pattern. For example, $X_f$ may represent the likelihood of the grid cell pair to switch from the cross flow direction pattern A (311-1) during the current computation iteration to a different pattern (e.g., a non-cross flow direction pattern or a cross flow direction pattern such as the cross flow direction pattern B (311-2)) during the next computation iteration. A value of $X_f$ close to one indicates a pattern switch (e.g., of the grid cell pair or of the wellbore) is likely whereas a value of $X_f$ much larger than one may indicate that the grid cell pair or the wellbore is likely to remain in the current cross flow direction pattern.

While Eq. (1) through Eq. (4) apply to the cross flow direction pattern A (311-1), similar expressions may be derived for the cross flow direction pattern B (311-2) where the injection is into the grid cell 1 (310-2). Plotting the cross flow function $X_f$ for each cross flow direction pattern as a function of the pressure difference $P_1-P_0$ (i.e., cross flow function plot A (320) shown in FIG. 3.2) shows the stable region A (320-3) where the flow direction pattern is stable.

The stable region A (320-3) is constructed assuming $X_f$ is linear for each pattern with a slope equal to the inverse of the pressure drawdown (i.e., $Q_w/PI$). Within the boundaries of the stable region A (320-3), the wellbore is not cross flowing. In actuality however, the vertical sides of the stable region A (320-3) are very near to one another due to the large slopes. Thus switching between pattern A (i.e., cross flow direction pattern A (311-1)) and pattern B (i.e., cross flow direction pattern B (311-2)) which results in oscillations may not be avoided without intervention because the error in the simulated fluid pressure difference of $P_1-P_0$ may be larger than the horizontal length of the stable region A (320-3).

Within the stable region A (320-3), the compound inequality Eq. (5) below is valid.

$$1 \geq X_f \geq \frac{-PI_0}{PI_1} \qquad \text{Eq. (5)}$$

The inequality Eq. (5) may be transformed into Eq. (7) by replacing $X_f$ with its definition and using the pressure update relationship Eq. (6). For example, $p^{old}$ and $p^{new}$ in Eq. (6) may represent the simulated fluid pressures generated by the previous computation iteration and the current computation iteration, respectively, for a grid cell. As noted above, the incremental fluid pressure is the incremental amount of change in the simulated fluid pressure. Accordingly, $\Delta p$ represents the incremental fluid pressure generated by the current computation iteration. In another example, $p^{old}$ and $p^{new}$ in Eq. (6) may represent the simulated fluid pressures generated by the current computation iteration and the next computation iteration, respectively, for a grid cell. Accordingly, $\Delta p$ represents the incremental fluid pressure generated by the next computation iteration. Accordingly, Eq. (7) bounds the difference in the incremental fluid pressure between the grid cell 0 (310-1) and grid cell 1 (310-2). Further, the incremental fluid pressures for the grid cell 0 (310-1) and grid cell 1 (310-2) are denoted as $\Delta p_1$ and $\Delta p_2$, respectively.

$$p^{new} = p^{old} + \Delta p \qquad \text{Eq. (6)}$$

$$Q_w \frac{X_f^{old} - 1}{PI_0} \geq \Delta p_1 - \Delta p_0 \geq Q_w \frac{PI_1 X_f^{old} + PI_0}{PI_0 PI_1} \qquad \text{Eq. (7)}$$

Eq. (7) may be used to calculate a scaling factor as described blow.

In an example scenario of FIG. 3.1, the simulated fluid pressures $P_1$ and $P_0$ of the cross flow direction pattern A (311-1) are converging in the current computation iteration. Therefore $\Delta p_1$ and $\Delta p_0$ have opposite signs with $\Delta p_1$ negative.

In a simplified example where $\Delta p_1$ and $\Delta p_0$ are equal in magnitude, Eq. (7) may be simplified into Eq. (8) below by replacing $\Delta p_1 - \Delta p_0$ with $-2\Delta p_{stable}$ where $\Delta p_{stable}$ represents the simplified common value of $\Delta p_1$ and $\Delta p_0$ (with the same sign as $\Delta p_0$) for the grid cell 0 (310-1) and grid cell 1 (310-2) to be within the stable region A (320-3).

$$-Q_w \frac{X_f^{old} - 1}{2PI_0} \leq \Delta p_{stable} \leq -Q_w \frac{PI_1 X_f^{old} + PI_0}{2PI_0 PI_1} \qquad \text{Eq. (8)}$$

A sample calculation may be made by further assuming $PI_0$ and $PI_1$ are equal and $X_f^{old}$ is equal to one. A cross flow function at or very near one indicates that pattern switching is imminent. With these simplifications, Eq. (8) may be converted into the upper bound $$\frac{-Q_w}{PI}$$

and lower bound 0 imposed on the difference in the incremental fluid pressure between the grid cell 0 (310-1) and grid cell 1 (310-2), are shown below:

$$\Delta p_{stable} \geq 0 \qquad \text{Eq. (9)}$$

$$\Delta p_{stable} \leq \frac{-Q_w}{PI} \qquad \text{Eq. (10)}$$

The lower bound 0 in Eq. (9) is automatically satisfied. The upper bound $$\frac{-Q_w}{PI}$$

in Eq. (10) restricts the pressure solution (i.e., the difference in the incremental fluid pressure between the grid cell 0 (310-1) and grid cell 1 (310-2) in the computation iteration) to be less than the pressure drawdown across the injecting connection. For long horizontal injectors this restriction may be quite severe. The drawdown pressures may be on the order of tenths to hundredths of a psi (i.e., pound per square inch).

To reduce the oscillation condition in the computation iterations, a scaling factor based on any value of $\Delta p_{stable}$ less than the upperbound $$\frac{-Q_w}{PI}$$

is used to scale and confine the incremental fluid pressure to ensure stability. Eq. (11) and Eq. (12) below allow the solution length for each connection cell to be within the stable region A (320-3). In Eq. (11) and Eq. (12), the subscript "unscaled" denotes the incremental fluid pressure as generated by the simulation engine prior to being scaled using the scaling factor. The subscript "scaled" denotes the adjusted incremental pressure after being scaled using the scaling factor.

$$sf = \frac{\Delta p_{stable}}{|\Delta p|_{unscaled}} \qquad \text{Eq. (11)}$$

$$\Delta p_{scaled} = sf \Delta p_{unscaled} \qquad \text{Eq. (12)}$$

In another example where $\Delta p_1$ and $\Delta p_0$ are not equal in magnitude, Eq. (7) may be converted into Eq. (13) below by denoting the maximum of the $|\Delta p_1|$ and $|\Delta p_0|$ as $|\Delta p|_{max}$, and denoting the minimum of the $|\Delta p_1|$ and $|\Delta p_0|$ as $|\Delta p|_{min}$.

$$-Q_w \frac{X_f^{old} - 1}{\left(1 \pm \frac{|\Delta p|_{min}}{|\Delta p|_{max}}\right) PI_0} \leq \Delta p_{stable} \leq -Q_w \frac{PI_1 X_f^{old} + PI_0}{\left(1 \pm \frac{|\Delta p|_{min}}{|\Delta p|_{max}}\right) PI_0 PI_1} \qquad \text{Eq. (13)}$$

The plus sign is used when the product of the pressure deltas is negative and the negative sign is used when the product is positive. In the latter scenario a check is put in place to prevent dividing by zero should the pressure deltas be equal.

While Eq. (13) applies to the simplified scenario of two connections of the wellbore, the description below generalizes the two-connection model to any number of connections where the grid cell pair may include non-adjoining grid cells. In particular, the two-connection stability model includes Eq. (1) through Eq. (13) and is based on a single scaling factor in Eq. (11) and Eq. (12) for the single grid cell pair in the two-connection scenario. At any given computation iteration for the N-connection scenario where N>2, a single pair of grid cells may exist that is most likely to transition next and whose scaling factor is most limiting. Accordingly, for extending to N-connections, the 2-connection calculations are applied one grid cell pair at a time until each connection is flowing in a stable pattern.

Deciding which grid cell pair is most likely to transition next is established using a two step procedure described using the simulation plot B (321) shown in FIG. 3.2.

(a) Order the simulated fluid pressures of the connection cells as the simulated fluid pressure sequence (322) from $p_0$ through $p_N$ according to an increasing order of pressure values. In particular, the position of each simulated fluid pressure in the simulated fluid pressure sequence (322) is independent of the physical location of a corresponding grid cell along the wellbore.

(b) Locate the bottom-hole pressure $p_{bh}$ within $p_i$ and $p_{i+1}$ in the simulated fluid pressure sequence (322) according to the order of pressure values. In other words, $P_i$ and $P_{i+1}$ sandwich the bottom-hole pressure $p_{bh}$ as the lower bound and upper bound, respectively. The grid cell pair corresponding to the simulated fluid pressures $P_i$ and $P_{i+1}$ is then selected from the collection of each grid cell connected to the wellbore as the grid cell pair most likely to transition next. In particular, the grid cells corresponding to $p_i$ and $p_{i+1}$ are not necessarily adjoining each other along the wellbore or adjacent to each other in the reservoir. Throughout Eq. (14) through Eq. (20), $p_i$ and $p_{i+1}$ correspond to the grid cell pair most likely to transition next.

$$p_{bh} = p_i + c(p_{i+1} - p_i) \qquad \text{Eq. (14)}$$

Eq. (14) is a parameterized relationship between the bottom-hole pressure $p_{bh}$ and the bounding connection cell pressures $p_i$ and $p_{i+1}$ to remove the bottom-hole pressure $p_{bh}$ from the rate constraint equation Eq. (1). One additional adjustment however, is to account for the addition or loss of fluids attributed to the non-transitioning connections. Eq. (15) is the resulting constraint equation with the bottom-hole pressure Pbh removed using Eq. (14).

$$Q_w = PI_i(p_i - (p_i + c(p_{i+1} - p_i))) + \qquad \text{Eq. (15)}$$
$$PI_{i+1}(p_{i+1} - (p_i + c(p_{i+1} - p_i))) + \sum_j^{NTC} q_j$$

Eq. (15) may be converted into Eq. (17) using the algebraic manipulations in deriving the two-connection stability model above with the exception that $Q_w$ is replaced with $Q_{net}$ defined in Eq. (16).

$$Q_{net} = Q_w = \sum_j^{NTC} q_j \qquad \text{Eq. (16)}$$

$$-Q_{net} \frac{X_f^{old} - 1}{\left(1 \pm \frac{|\Delta p|_{min}}{|\Delta p|_{max}}\right) PI_i} \leq \qquad \text{Eq. (17)}$$

$$\Delta p_{stable} \leq -Q_{net} \frac{PI_{i+1} X_f^{old} + PI_i}{\left(1 \pm \frac{|\Delta p|_{min}}{|\Delta p|_{max}}\right) PI_i PI_{i+1}}$$

Eq. (17) may be considered as corresponding to either the $i^{th}$ connection or the $(i+1)^{th}$ connection. In particular, $|\Delta p|_{max}$ denotes the maximum of the $|\Delta p_i|$ and $|\Delta p_{i+1}|$, and $|\Delta p|_{min}$ denotes the minimum of the $|\Delta p_i|$ and $|\Delta p_{i+1}|$ Since $Q_{net}$ is not constant as is $Q_w$, some error is expected in this calculation. As the connections near transitioning ($X_f^{old} \to 1$), the error reduces to zero because the producing connection's rate is approaching zero which results in the injecting connection's rate becoming $Q_{net}$. However, to compensate for this inaccuracy (while $X_f^{old} \gg 1$), a flexible formula using both the lower and upper bounds is presented next. Specifically, the lower and upper bounds are defined using Eq. (18) below.

$$L_{bound} = -Q_{net} \frac{X_f^{old} - 1}{\left(1 \pm \frac{|\Delta p|_{min}}{|\Delta p|_{max}}\right) PI_i} \text{ and} \quad \text{Eq. (18)}$$

$$U_{bound} = -Q_{net} \frac{PI_{i+1} X_f^{old} + PI_i}{\left(1 \pm \frac{|\Delta p|_{min}}{|\Delta p|_{max}}\right) PI_i PI_{i+1}}$$

Then, using an interpolation parameter d, $\Delta p_{stable}$ may be calculated anywhere in the range between the lower bound ($L_{bound}$) and the upper bound ($U_{bound}$) using Eq. (19).

$$\Delta p_{stable} = L_{bound} + d(U_{bound} - L_{bound}) \quad \text{Eq. (19)}$$

In summary for the N-connection stability model, the grid cell pair most likely to switch next is first determined as shown in FIG. 3.2. The $\Delta p_{stable}$ is then computed using Eq. (19) based on the selected grid cell pair most likely to switch next. Accordingly, the scaling factor for the selected grid cell pair most likely to switch next is computed using Eq. (11) described above and reproduced here for reference.

$$sf = \frac{\Delta p_{stable}}{|\Delta p|_{unscaled}} \quad \text{Eq. (11)}$$

Finally, using Eq. (12) described above and reproduced here for reference, the incremental fluid pressures for all grid cells are adjusted by scaling according to the single scaling factor of the selected grid cell pair most likely to switch next.

$$\Delta p_{scaled} = sf \Delta p_{unscaled} \quad \text{Eq. (12)}$$

Accordingly, instead of using the simulated fluid pressure generated by the simulation engine during the current computation iteration as the starting point for the next computation iteration, the adjusted simulated fluid pressure based on the scaled incremental fluid pressure is used as the starting point for the next computation iteration. In other words, Eq. (6) is replaced by Eq. (20) below for modifying the simulated fluid pressure $P^{old}$ generated in the previous computation iteration to generate the adjusted simulated fluid pressure $p^{new}$ as the input or starting point for the next computation iteration.

$$P^{new} = P^{old} + \Delta p_{scaled} \quad \text{Eq. (20)}$$

The value of the interpolating parameter d may be selected according to the tradeoff below. A value of the interpolation parameter d being near zero results in a small scaling factor. This, in turn, means little risk of oscillations occurring may exist but more non-linear computation iterations are required to converge. A value for the interpolation parameter d being near one increases the scaling factor which reduces the number of computation iterations to converge the non-linear algorithm but adds more risk that the scaling factor is too large and the resulting overshoot in the pressure solution will result in oscillations. FIG. 3.3 shows an example plot of the number of computation iterations versus the value of the interpolation parameter d. In the example shown in FIG. 3.3, the values of the interpolating parameter d between 1 and 4 reduces the number of computation iterations in a single time step to achieve numerical convergence, but only modestly compared to the reduction in computation iterations using the values of the interpolation parameter d between 0 and 1. Values above 1 also imply an extrapolation outside the stable region which increases the risk of oscillations in the solution.

FIG. 3.4 shows the SAGD simulation results A (340) for a single injector/producer pair to illustrate the two-connection stability model of pattern switching described above. As shown in FIG. 3.4, the SAGD simulation results A (340) is a plot of the simulated fluid pressures $P_0$ and $P_1$ versus cumulative number of computation iterations throughout a sequence of time steps during a user specified simulation time period (i.e., the simulation session). The converged pressures at the end of the time steps are recorded in the plot unless the time step went into oscillation in which case each connection cell's pressure is recorded in the plot for representative computation iterations within a single time step. For example, the enlarged view (341) shows $P_0$ and $P_1$ for multiple computation iterations within a single time step. An addition, the bottom-hole pressure $P_{bh}$ is plotted in the SAGD simulation results A 340) to indicate direction of cross flow.

In the example scenario shown in FIG. 3.4, steam injection begins after a 243-day heating period. The first few time steps (i.e., time step 1 (340-1), time step 2 (340-2), time step 3 (340-3), and time step 4 (340-4)) converge with the steam injector cross flowing from cell one (e.g., grid cell 1 (310-2) shown in FIG. 3.1) to cell zero (e.g., grid cell 0 (310-1) shown in FIG. 3.1), equilibrating the connection cell's pressures. This process is interrupted in the time step 5 (340-5) due to oscillations caused by numerical overshoots described above. After the time step size (i.e., length of time) of the time step 5 (340-5) is reduced using a conventional technique, a converged solution is again achieved through several computation iterations within the time step 5 (340-5) with the injector cross flowing as before. After additional three time steps, a second interruption occurs at the time step 9 (340-9) after which the ensuing reduced time step size allows the injector to transition from its cross flowing to a non-cross flowing state. The enlarged view (341) shows the three time steps and multiple computation iterations within the time step 9 (340-9).

Accordingly to the two-connection stability model of pattern switching, there are three possible outcomes to consider regarding the state of the flow direction pattern during the computation iterations:

(A) No change in the flow direction pattern.

(B) The flow pattern oscillates between cross flow states (e.g., the cross flow pattern A (311-1) and the cross flow pattern B (311-2) shown in FIG. 3.1 above).

(C) The flow direction pattern switches.

FIG. 3.5 shows a cross flow function plot B (350) to illustrate the connection between the pattern switching model and the three possible outcomes of the SAGD injector.

As shown in FIG. 3.5, the x-axis of the cross flow function plot B (350) is sectioned into three sub-domains based on the stable region B (351). The injector will transition from the cross flow direction pattern to the non-cross flow direction pattern if the pressure difference $P_1 - P_0$ is found within the sub-domain $$\left(\frac{Q_w}{PI_1}, \frac{-Q_w}{PI_0}\right).$$

This situation occurs only when the maximum pressure solution delta $|\Delta p|_{max}$ from the linear solver of the simulation engine is bound within the limits $L_{bound}$ and the $U_{bound}$ described above. However, if the maximum pressure solution delta $|\Delta p|_{max}$ is not bounded by these limits, then the pressure difference $P_1$-$P_0$ lies outside of the stable region B (351) with two possible scenarios below:

Scenario A: The maximum pressure solution delta $|\Delta p|_{max}$ from the linear solver is too large and overshooting is likely to result in oscillations, or Scenario B: The maximum pressure solution delta $|\Delta p|_{max}$ is so small that the current flow pattern remains.

FIG. 3.6 shows the SAGD simulation results B (360) which is a plot of incremental fluid pressure of the grid cell pair most likely to transition next versus the cumulative computation iteration throughout a number of time steps. Specifically the y-axis of the SAGD simulation results B (360) corresponds to the maximum pressure solution delta $\Delta p_{max}$. The SAGD simulation results B (360) is compared to TABLE 1 where calculations at various computation iterations illustrate stability calculation for predicting flow direction pattern behaviors using the N-connection stability model.

TABLE 1

| Iteration | 14 | 22 | 33 |
|---|---|---|---|
| $Q_w$ (lb-moles/day) | −73351.1 | −73351.1 | −73351.1 |
| $PI_0$ (lb-moles/day/psi) | 103670.6 | 103670.6 | 107547.0 |
| $PI_1$ (lb-moles/day/psi) | 74741.6 | 74741.6 | 77241.1 |
| $p_1^*$-$p_0^*$ (psi) | 7.37 | 7.37 | 1.06 |
| $X_f$ - calculated | 10.4 | 10.4 | 1.55 |
| Outcome | Oscillations | No Change in Injection Pattern | Injection Pattern Switches |

As shown in FIG. 3.6, the incremental fluid pressure A (361-1) is computed as −13.6 psi, which is the $\Delta p_{max}$ during the computation iteration 14 of the SAGD simulation results B (360). Using the data in TABLE 1 above, the lower limit for stability is calculated as:

$$L_{bound} = -Q_{net} \frac{X_f^{old} - 1}{\left(1 \pm \frac{|\Delta p|_{min}}{|\Delta p|_{max}}\right) PI_i} = 73351.1 \frac{10.4 - 1}{2 \times 103670.6} = 3.33 \text{ psi}$$

And the upper limit is:

$$U_{bound} = -Q_{net} \frac{PI_{i+1} X_f^{old} + PI_i}{\left(1 \pm \frac{|\Delta p|_{min}}{|\Delta p|_{max}}\right) PI_i PI_{i+1}} =$$

$$73351.1 \frac{74741.6 \times 10.4 + 103670.6}{2 \times 103670.6 \times 74741.6} = 4.17 \text{ psi}$$

In each of the calculations above, $$\frac{|\Delta p|_{min}}{|\Delta p|_{max}} = 1$$

is assumed.

Thus at iteration 14, the maximum pressure change for a stable transition out of the current cross flow direction pattern should fall within the limits described by the following inequality.

$$3.33 \leq \Delta p_{stable} \leq 4.17$$

Given that the maximum pressure solution $\Delta p_{max}$ (−13.6) is far greater in absolute value than the upper limit, the N-connection stability model predicts oscillations to occur, which is consistent with the SAGD simulation results B (360). The conventional technique is applied to control the oscillations by reducing the time step size following the iteration 14. Accordingly, the incremental fluid pressure B (361-2) is computed as 3.09 psi in absolute value, which corresponds to the $\Delta p_{max}$ at the computation iteration 22. This value does not exceed the $L_{bound}$ of 3.33 psi for the injector to transition from its current cross flow state. Thus the time step size reduction was sufficient to allow the simulator to converge and the injector remained in its current pattern as predicted.

Calculations for the computation iteration 33 are given below.

Lower Limit:

$$L_{bound} = -Q_{net} \frac{X_f^{old} - 1}{\left(1 \pm \frac{|\Delta p|_{min}}{|\Delta p|_{max}}\right) PI_i} = 73351.1 \frac{1.55 - 1}{2 \times 107547.0} = 0.19 \text{ psi}$$

The Upper Limit:

$$U_{bound} = -Q_{net} \frac{PI_{i+1} X_f^{old} + PI_i}{\left(1 \pm \frac{|\Delta p|_{min}}{|\Delta p|_{max}}\right) PI_i PI_{i+1}} =$$

$$73351.1 \frac{77241.1 \times 1.55 + 107547.0}{2 \times 107547.0 \times 77241.1} = 1.00 \text{ psi}$$

These calculations result in $0.19 \leq \Delta p_{stable} \leq 1.00$.

The incremental fluid pressure C (361-3) is 0.75 psi, which corresponds to the $\Delta p_{max}$ at the computation iteration 33. This value lies within the bounds for a stable transition from the cross flow direction pattern to the non-cross flow direction pattern. The well's injection pattern did transition to a non-cross flow state in agreement with the simulated well behavior of the SAGD simulation results B (360).

Performance testing has been conducted using a sector of a heavy oil simulation model with a rectangular grid of dimensions 38×13×42. The oil viscosity is around 3,500 centipoise at initial reservoir temperature and pressure. There are two well pairs. Wells are approximately 2000 feet long and nearly horizontal. Connection transmissibilities range from 500 to over 1000 setting up small drawdowns conducive to well cross flow and numerical oscillations. The wells are produced for an initial period of 425 days after which a period of cyclic steam injection begins. At 1,187 days two wells, one from each pair, are designated injectors and steam is continuously injected for the remainder of the simulation.

Two simulation runs were made, one with Pattern Switching Technology (PST) on and one with the PST off. As used herein, the PST refers to suppressing numerical oscillation by adjusting the incremental fluid pressure using the scaling factor of the selected grid cell pair most likely to switch next. In particular, the PST prevents the numerical oscillation without the need to reduce the time step size. For both simulation runs, production and injection rates for the wells were identical throughout the entire simulation time period. However, from a performance perspective, the two simulation runs are very different beginning with steam injection.

TABLE 3

|  | Total Time Steps | Total Newtons | Time Step Chops |
|---|---|---|---|
| PST: OFF | 8722 | 35330 | 1148 |
| PST: ON | 1955 | 6270 | 52 |

As shown in TABLE 3, overall the total number of computation iterations was nearly 6 times larger (i.e., 35330 versus 6270) for the simulation run without using PST. This result is attributed to oscillations in pattern switching causing Newton convergence failure in many time steps thus requiring the time step size to be reduced (i.e., 1148 time step chops) and total number of time steps to increase over four times (i.e., 8722 versus 1955). Convergence failures were more than 20 times greater for the simulation run without PST than the simulation run with PST.

FIG. 3.7 shows the comparison of cumulative computation iterations versus time steps for the two simulation runs. The simulation run without PST is represented by the curve A (371) while the simulation run with PST is represented by the curve B (372). In summary, pattern switching in an injection well causes severe degradation in a reservoir simulator's performance due to oscillations in Newton's method resulting in convergence failure and subsequent time step chop. Mathematical models (i.e., the two-connection stability model and the N-connection stability model) to describe pattern switching in constant rate injection wells are derived and described above. For example, the N-connection stability model predicts the upper and lower bounds on pressure changes of connection cells that lead to stable pattern transition. Formulae for the computing scaling factors based on the N-connection stability model are provided for numerical reservoir simulators to incorporate into the computation iteration scheme. Results for a thermal test model with both cyclic and continuous steam injection show a five to six fold improvement in computational performance using the Pattern Switching Technology.

Embodiments of suppressing oscillations due to pattern switching in low drawdown wells may be implemented on virtually any type of computing system regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of suppressing oscillations due to pattern switching in low drawdown wells. For example, as shown in FIG. 4, the computing system (400) may include one or more computer processor(s) (402), associated memory (404) (e.g., random access memory (RAM), cache memory, flash memory, etc.), one or more storage device(s) (406) (e.g., a hard disk, an optical drive such as a compact disk (CD) drive or digital versatile disk (DVD) drive, a flash memory stick, etc.), and numerous other elements and functionalities. The computer processor(s) (402) may be an integrated circuit for processing instructions. For example, the computer processor(s) may be one or more cores, or micro-cores of a processor. The computing system (400) may also include one or more input device(s) (410), such as a touchscreen, keyboard, mouse, microphone, touchpad, electronic pen, or any other type of input device. Further, the computing system (400) may include one or more output device(s) (408), such as a screen (e.g., a liquid crystal display (LCD), a plasma display, touchscreen, cathode ray tube (CRT) monitor, projector, or other display device), a printer, external storage, or any other output device. One or more of the output device(s) may be the same as or different from the input device. The computing system (400) may be connected to a network (412) (e.g., a local area network (LAN), a wide area network (WAN) such as the Internet, mobile network, or any other type of network) via a network interface connection (not shown). The input and output device(s) may be locally or remotely (e.g., via the network (412)) connected to the computer processor(s) (402), memory (404), and storage device(s) (406). Many different types of computing systems exist, and the aforementioned input and output device(s) may take other forms.

Software instructions in the form of computer readable program code to perform embodiments of suppressing oscillations due to pattern switching in low drawdown wells may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of suppressing oscillations due to pattern switching in low drawdown wells.

Further, one or more elements of the aforementioned computing system (400) may be located at a remote location and connected to the other elements over a network (412). Further, embodiments of suppressing oscillations due to pattern switching in low drawdown wells may be implemented on a distributed system having a plurality of nodes, where each portion of suppressing oscillations due to pattern switching in low drawdown wells may be located on a different node within the distributed system. In one or more embodiments, the node corresponds to a distinct computing device. In one or more embodiments, the node corresponds to a computer processor with associated physical memory. In one or more embodiments, the node corresponds to a computer processor or micro-core of a computer processor with shared memory and/or resources.

The systems and methods provided relate to the acquisition of hydrocarbons from an oilfield. It will be appreciated that the same systems and methods may be used for performing subsurface operations, such as mining, water retrieval, and acquisition of other underground fluids or other geomaterials from other fields. Further, portions of the systems and methods may be implemented as software, hardware, firmware, or combinations thereof.

While suppressing oscillations due to pattern switching in low drawdown wells has been described with respect to a limited number of embodiments, those skilled in the art, having benefit of this disclosure, will appreciate that other embodiments can be devised which do not depart from the scope of suppressing oscillations due to pattern switching in low drawdown wells as disclosed herein. Accordingly, the scope of suppressing oscillations due to pattern switching in low drawdown wells should be limited based on the attached claims.

What is claimed is:

1. A method to perform a field operation in a field, comprising:
obtaining, from a simulation engine simulating the field operation, a plurality of simulation variable values corresponding to a plurality of grid cells, wherein the plurality of grid cells represents at least a portion of the field for simulating the field operation;

analyzing, using a connection stability model by a computer processor, the plurality of simulation variable values to generate a scaling factor, wherein the scaling factor controls intermediate result deviation between computation iterations of simulating the field operation to suppress oscillations of cross flow direction patterns;

adjusting, for the plurality of grid cells, the plurality of the simulation variable values according to the scaling factor to generate a plurality of adjusted simulation variable values;

generating, by the computer processor using the simulation engine, a simulation result based at least on the plurality of adjusted simulation variable values; and performing the field operation based on the simulation result.

2. The method of claim 1, wherein analyzing the plurality of simulation variable values to generate the scaling factor comprises:

selecting, based on a pre-determined criterion, a grid cell from the plurality of grid cells;

calculating, based on the plurality of simulation variable values, a simulation variable limit associated with the grid cell;

identifying a simulation variable value of the plurality of simulation variable values that is associated with the grid cell; and calculating the scaling factor based on the simulation variable limit and the simulation variable value of the grid cell.

3. The method of claim 2, further comprising:

generating, using the simulation engine and for each of the plurality of grid cells during a computation iteration for completing a time step in simulating the field operation:

a simulated flow direction that is a first intermediate result of the time step; and an incremental fluid pressure for modifying a simulated fluid pressure to start a next computation iteration for completing the time step, wherein the simulated fluid pressure is generated during a previous computation iteration as a second intermediate result of the time step, wherein the plurality of simulation variable values comprises the simulated fluid pressure, the simulated flow direction, and the incremental fluid pressure for each of the plurality of grid cells, and wherein adjusting the plurality of the simulation variable values comprise adjusting the incremental fluid pressure for each of the plurality of grid cells.

4. The method of claim 3, further comprising:

identifying, based on the simulated flow direction of each of the plurality of grid cells, a flow direction pattern of a wellbore of the field operation, wherein the plurality of grid cells is connected to the wellbore; and selecting, from the plurality of grid cells, a grid cell pair based on a likelihood of the grid cell pair contributing to a switch of the flow direction pattern from a first computation iteration to a second computation iteration, wherein the oscillation condition comprises the switch of the flow direction pattern, wherein the grid cell pair comprises the grid cell for calculating the scaling factor used for starting the second computation iteration.

5. The method of claim 4, further comprising:

generating, using the simulation engine during the first computation iteration, a simulated bottom hole pressure of the wellbore; and comparing the simulated fluid pressure of each of the plurality of grid cells and the simulated bottom hole pressure to select the grid cell pair, wherein the likelihood of the grid cell pair contributing to the switch of the flow direction pattern is dependent on a difference between the simulated fluid pressure and the simulated bottom hole pressure.

6. The method of claim 5, further comprising:

calculating, based on a simulated pressure drawdown of the wellbore and a difference of the simulated fluid pressure of the grid cell pair, a probability of the switch of the flow direction pattern from the first computation iteration to the second computation iteration, wherein the simulation variable limit associated with the grid cell is calculated based at least on the probability of the switch of the flow direction pattern, a simulated wellbore productivity index of the grid cell pair, and the incremental fluid pressure of the grid cell pair.

7. The method of claim 6, wherein generating the simulation result based at least on the plurality of adjusted simulation variable values results in a reduced number of computation iterations of the simulation engine to complete the time step in simulating the field operation, and wherein the scaling factor converges to one as the simulation result converges for the time step through the reduced number of computation iterations.

8. The non-transitory computer readable medium of claim 5, further comprising:

calculating, based on a simulated pressure drawdown of the wellbore and a difference of the simulated fluid pressure of the grid cell pair, a probability of the switch of the flow direction pattern from the first computation iteration to the second computation iteration, wherein the simulation variable limit associated with the grid cell is calculated based at least on the probability of the switch of the flow direction pattern, a simulated wellbore productivity index of the grid cell pair, and the incremental fluid pressure of the grid cell pair, wherein generating the simulation result based at least on the plurality of adjusted simulation variable values results in a reduced number of computation iterations of the simulation engine to complete the time step in simulating the field operation, and wherein the scaling factor converges to one as the simulation result converges for the time step through the reduced number of computation iterations.

9. A system to perform a field operation in a field, comprising:

a plurality of data acquisition tools disposed in the field and configured to generate a plurality of exploration and production (E&P) data sets associated with a plurality of geological structures and a plurality of wells in the field; and an E&P tool executing on a computer processor and configured to perform E&P activities in the field, the E&P tool comprising:

a simulation control module configured to:

obtain, from a simulation engine simulating the field operation, a plurality of simulation variable values corresponding to a plurality of grid cells, wherein the plurality of grid cells represents at least a portion of the field for simulating the field operation;

analyze, using a connection stability model by a computer processor, the plurality of simulation variable values to generate a scaling factor, wherein the scaling factor controls intermediate result deviation between computation iterations of simulating the field operation to suppress oscillations of cross flow direction patterns; and adjust, for the plurality of grid cells, the plurality of the simulation variable values according to the scaling factor to generate a plurality of adjusted simulation variable values;

the simulation engine executing on the computer processor and configured to generate a simulation result based at least on the plurality of adjusted simulation variable values; and an E&P task engine executing on the computer processor and configured to perform the field operation based on the simulation result.

10. The system of claim 9, wherein analyzing the plurality of simulation variable values to generate the scaling factor comprises:

selecting, based on a pre-determined criterion, a grid cell from the plurality of grid cells;

calculating, based on the plurality of simulation variable values, a simulation variable limit associated with the grid cell;

identifying a simulation variable value of the plurality of simulation variable values that is associated with the grid cell; and calculating the scaling factor based on the simulation variable limit and the simulation variable value of the grid cell.

11. The system of claim 10, the simulation engine further configured to:

generate, for each of the plurality of grid cells during a computation iteration for completing a time step in simulating the field operation:

a simulated flow direction that is a first intermediate result of the time step; and an incremental fluid pressure for modifying a simulated fluid pressure to start a next computation iteration for completing the time step, wherein the simulated fluid pressure is generated during a previous computation iteration as a second intermediate result of the time step, wherein the plurality of simulation variable values comprises the simulated fluid pressure, the simulated flow direction, and the incremental fluid pressure for each of the plurality of grid cells, and wherein adjusting the plurality of the simulation variable values comprises adjusting the incremental fluid pressure for each of the plurality of grid cells.

12. The system of claim 11, the simulation control module further configured to:

identify, based on the simulated flow direction of each of the plurality of grid cells, a flow direction pattern of a wellbore of the field operation, wherein the plurality of grid cells is connected to the wellbore; and select, from the plurality of grid cells, a grid cell pair based on a likelihood of the grid cell pair contributing to a switch of the flow direction pattern from a first computation iteration to a second computation iteration, wherein the oscillation condition comprises the switch of the flow direction pattern, wherein the grid cell pair comprises the grid cell for calculating the scaling factor used for starting the second computation iteration.

13. The system of claim 12, wherein the simulation engine is further configured to generate, during the first computation iteration, a simulated bottom hole pressure of the wellbore, wherein the simulation control module is further configured to compare the simulated fluid pressure of each of the plurality of grid cells and the simulated bottom hole pressure to select the grid cell pair, and wherein the likelihood of the grid cell pair contributing to the switch of the flow direction pattern is dependent on a difference between the simulated fluid pressure and the simulated bottom hole pressure.

14. The system of claim 13, the simulation control module further configured to:

calculate, based on a simulated pressure drawdown of the wellbore and a difference of the simulated fluid pressure of the grid cell pair, a probability of the switch of the flow direction pattern from the first computation iteration to the second computation iteration, wherein the simulation variable limit associated with the grid cell is calculated based at least on the probability of the switch of the flow direction pattern, a simulated wellbore productivity index of the grid cell pair, and the incremental fluid pressure of the grid cell pair.

15. The system of claim 14, wherein generating the simulation result based at least on the plurality of adjusted simulation variable values results in a reduced number of computation iterations of the simulation engine to complete the time step in simulating the field operation, and wherein the scaling factor converges to one as the simulation result converges for the time step through the reduced number of computation iterations.

16. A non-transitory computer readable medium comprising instructions to perform a field operation in a field, the instructions when executed by a computer processor comprising functionality for:

obtaining, from a simulation engine simulating the field operation, a plurality of simulation variable values corresponding to a plurality of grid cells, wherein the plurality of grid cells represents at least a portion of the field for simulating the field operation;

analyzing, using a connection stability model, the plurality of simulation variable values to generate a scaling factor, wherein the scaling factor controls intermediate result deviation between computation iterations of simulating the field operation to suppress oscillations of cross flow direction patterns;

adjusting, for the plurality of grid cells, the plurality of the simulation variable values according to the scaling factor to generate a plurality of adjusted simulation variable values;

generating, by the simulation engine, a simulation result based at least on the plurality of adjusted simulation variable values; and performing the field operation based on the simulation result.

17. The non-transitory computer readable medium of claim 16, wherein analyzing the plurality of simulation variable values to generate the scaling factor comprises:

selecting, based on a pre-determined criterion, a grid cell from the plurality of grid cells;

calculating, based on the plurality of simulation variable values, a simulation variable limit associated with the grid cell;

identifying a simulation variable value of the plurality of simulation variable values that is associated with the grid cell; and calculating the scaling factor based on the simulation variable limit and the simulation variable value of the grid cell.

18. The non-transitory computer readable medium of claim 17, the instructions when executed by the computer processor further comprising functionality for:

generating, using the simulation engine and for each of the plurality of grid cells during a computation iteration for completing a time step in simulating the field operation:

a simulated flow direction that is a first intermediate result of the time step; and an incremental fluid pressure for modifying a simulated fluid pressure to start a next computation iteration for completing the time step, wherein the simulated fluid pressure is generated during a previous computation iteration as a second intermediate result of the time step, wherein the plurality of simulation variable values comprises the simulated fluid pressure, the simulated flow direction, and the incremental fluid pressure for each of the plurality of grid cells, and wherein adjusting the plurality of the simulation variable values comprise adjusting the incremental fluid pressure for each of the plurality of grid cells.

19. The non-transitory computer readable medium of claim 18, the instructions when executed by the computer processor further comprising functionality for:

identifying, based on the simulated flow direction of each of the plurality of grid cells, a flow direction pattern of a wellbore of the field operation, wherein the plurality of grid cells is connected to the wellbore; and selecting, from the plurality of grid cells, a grid cell pair based on a likelihood of the grid cell pair contributing to a switch of the flow direction pattern from a first computation iteration to a second computation iteration, wherein the oscillation condition comprises the switch of the flow direction pattern, wherein the grid cell pair comprises the grid cell for calculating the scaling factor used for starting the second computation iteration.

20. The non-transitory computer readable medium of claim 19, the instructions when executed by the computer processor further comprising functionality for:

generating, using the simulation engine during the first computation iteration, a simulated bottom hole pressure of the wellbore; and comparing the simulated fluid pressure of each of the plurality of grid cells and the simulated bottom hole pressure to select the grid cell pair, wherein the likelihood of the grid cell pair contributing to the switch of the flow direction pattern is dependent on a difference between the simulated fluid pressure and the simulated bottom hole pressure.

* * * * *